(12) United States Patent
Fujisawa

(10) Patent No.: US 8,769,194 B2
(45) Date of Patent: Jul. 1, 2014

(54) INFORMATION PROCESSING SYSTEM INCLUDING SEMICONDUCTOR DEVICE HAVING SELF-REFRESH MODE

(76) Inventor: Hiroki Fujisawa, Tokyo (JP)

(*) Notice: Subject to any disclaimer, the term of this patent is extended or adjusted under 35 U.S.C. 154(b) by 152 days.

(21) Appl. No.: 13/559,448

(22) Filed: Jul. 26, 2012

(65) Prior Publication Data

US 2013/0031305 A1   Jan. 31, 2013

(30) Foreign Application Priority Data

Jul. 28, 2011   (JP) ................. 2011-165713

(51) Int. Cl.
*G06F 12/02* (2006.01)
*G11C 11/4072* (2006.01)
*G11C 11/4076* (2006.01)
*G11C 11/406* (2006.01)

(52) U.S. Cl.
CPC ........ *G11C 11/4072* (2013.01); *G11C 11/4076* (2013.01); *G11C 11/40611* (2013.01)
USPC ............................. 711/106; 711/154; 713/322

(58) Field of Classification Search
CPC ..................... G11C 11/4074; G11C 11/40611; G11C 11/4076
USPC .................................. 711/106, 154; 713/322
See application file for complete search history.

(56) References Cited

U.S. PATENT DOCUMENTS

| 6,373,303 | B2 |  | 4/2002 | Akita |  |
|---|---|---|---|---|---|
| 7,164,615 | B2 | * | 1/2007 | Park et al. | 365/222 |
| 7,200,062 | B2 | * | 4/2007 | Kinsely et al. | 365/222 |
| 7,349,277 | B2 | * | 3/2008 | Kinsley et al. | 365/222 |
| 8,363,503 | B2 | * | 1/2013 | Sato et al. | 365/227 |
| 8,537,626 | B2 | * | 9/2013 | Fujisawa et al. | 365/194 |
| 2001/0043097 | A1 |  | 11/2001 | Akita |  |
| 2009/0083479 | A1 | * | 3/2009 | Lee et al. | 711/106 |
| 2011/0058437 | A1 |  | 3/2011 | Miyano |  |

FOREIGN PATENT DOCUMENTS

| JP | 2001-332086 A | 11/2001 |
|---|---|---|
| JP | 2011-061457 A | 3/2011 |

* cited by examiner

*Primary Examiner* — Stephen Elmore
(74) *Attorney, Agent, or Firm* — McGinn IP Law Group, PLLC

(57) ABSTRACT

Disclosed herein is an information processing system having first and second devices. The second device alternately issues a self-refresh command and a self-refresh exit command to the first device. The first device performs a refresh operation once in response to the self-refresh command and updates a state of a DLL circuit in response to the self-refresh exit command.

15 Claims, 20 Drawing Sheets

| SYMBOL | CKE PRIOR CYCLE | CKE CURRENT CYCLE | CSB | FASB | CASB | WEB |
|---|---|---|---|---|---|---|
| REF | H | H | L | L | L | H |
| SRE | H | L | L | L | L | H |
| SRX | L | H | H | — | — | — |
| PDE | H | L | L | H | H | H |
| PDX | L | H | H | — | — | — |

FIG.4

| DIMM401 | | DIMM402 | |
| --- | --- | --- | --- |
| RANK1 | RANK2 | RANK1 | RANK2 |
| 120 Ω | ODT off | ODT off | 30 Ω |

FIG.21A

| DIMM401 | | DIMM402 | |
| --- | --- | --- | --- |
| RANK1 | RANK2 | RANK1 | RANK2 |
| ODT off | 30 Ω | 120 Ω | ODT off |

FIG.21B

| DIMM401 | | DIMM402 | |
| --- | --- | --- | --- |
| RANK1 | RANK2 | RANK1 | RANK2 |
| ODT off | ODT off | ODT off | 30 Ω |

FIG.21C

| DIMM401 | | DIMM402 | |
| --- | --- | --- | --- |
| RANK1 | RANK2 | RANK1 | RANK2 |
| ODT off | 30 Ω | ODT off | ODT off |

FIG.21D

INFORMATION PROCESSING SYSTEM INCLUDING SEMICONDUCTOR DEVICE HAVING SELF-REFRESH MODE

BACKGROUND OF THE INVENTION

1. Field of the Invention

The present invention relates to an information processing system and a control method thereof, and more particularly to an information processing system including a semiconductor device with a self-refresh mode and a control method thereof. The present invention also relates to a control method of a controller, and more particularly to a controller that controls a semiconductor device with a self-refresh mode and a control method thereof.

2. Description of Related Art

In a semiconductor device that performs an operation in synchronism with a clock signal such as a synchronous DRAM (Dynamic Random Access Memory), an internal clock signal phase-controlled is often required inside of the semiconductor device. The phase-controlled internal clock signal is mainly generated by a DLL (Delay Locked Loop) circuit included in the semiconductor device (see Japanese Patent Application Laid-open No. 2011-61457). The DLL circuit includes a delay line that delays the internal clock signal and a delay amount thereof is determined based on a count value output from a counter circuit. The counter circuit is controlled by a phase control circuit having a comparing unit that compares phases of an external clock signal supplied from outside and the internal clock signal. Because the DLL circuit is a circuit block that consumes a relatively large amount of power, the semiconductor device described in Japanese Patent Application Laid-open No. 2011-61457 reduces power consumption by intermittently performing a phase control operation.

Meanwhile, an operation mode called a self-refresh mode is provided for the DRAM. The self-refresh mode is a kind of standby mode in which refresh of storage data included in storage cells is periodically performed inside of the DRAM in asynchronism with outside. A controller can stop issuance of many external signals such as an external clock signal and a command signal to be supplied to the semiconductor device, during a period when the semiconductor device has entered the self-refresh mode. During the period when the semiconductor device has entered the self-refresh mode, an input first-stage circuit such as a clock receiver included in the DRAM to receive a signal supplied from outside is inactivated and operations of circuit blocks such as the DLL circuit are also stopped. Accordingly, when the semiconductor device has entered the self-r fresh mode, entire power consumption of the system becomes quite low. Furthermore, the refresh operation is periodically performed inside of the DRAM, so that the storage data are not lost.

However, once the semiconductor device has entered the self-refresh mode, it takes a relatively long time to enable input of a next command after the semiconductor device exits the self-refresh mode.

The first reason thereof is that a refresh operation is performed in asynchronism with an external clock signal during the self-refresh mode and thus the refresh operation may be performed at a time when a self-refresh exit command is issued. Therefore, even after the self-refresh exit command is issued, a row command (such as an active command or an auto-refresh command) cannot be issued during a refresh period required for one refresh operation.

The second reason is that the operation of the DLL circuit stops during the period when the semiconductor device has entered the self-refresh mode. Consequently, it takes a long time for the DLL circuit to be locked again (for example, to set a delay amount reset in the DLL circuit to match phases of the external clock signal and the internal clock signal with each other) after the semiconductor device exits the self-refresh mode. This means delay of a command issued by the controller after the exit. This means, for example, that a long time is required after the semiconductor device exits the self-refresh mode and before input of a command (a read command and the like) requiring a phase-controlled internal clock signal becomes possible.

To solve this problem, a method that enables to intermittently activates an DLL circuit also during a period when a semiconductor device has entered a self-refresh mode is proposed in Japanese Patent Application Laid-open No. 2001-332086. Although such an operation does not comply with DRAM standards, a time required after the semiconductor device exits from the self-refresh mode and before the DLL circuit is locked again can be greatly reduced by performing this operation.

However, in the DRAM described in Japanese Patent Application Laid-open No. 2001-332086, while a timing when a command requiring an internal clock signal phase-controlled is input after the semiconductor device exits the self-refresh mode can be made earlier, the other problem (the first reason) cannot be solved. That is, a timing when a row command is input after the semiconductor device exits the self-refresh mode cannot be made earlier. Accordingly, it is necessary to wait for a relatively long time to input the active command or the like after the semiconductor device exits the self-refresh mode.

This problem occurs not only in the DRAM but also in all semiconductor devices with the self-refresh mode. For example, there is the same problem also in a semiconductor device that in a part includes nonvolatile memory cells having a problem of cell data retention.

SUMMARY

In one embodiment, there is provided a semiconductor device that includes: a first input buffer circuit to which an external clock signal having a predetermined frequency is supplied from outside; a DLL circuit that generates an internal clock signal that is phase-controlled based on an output signal from the first input buffer circuit; a memory cell array that has a plurality of memory cells requiring an refresh operation in order to retain of storage data therein; an output buffer circuit that outputs the storage data read from the memory cell array to outside through a data terminal synchronously with the internal clock signal; and an access control circuit. The access control circuit performs an access operation to the memory cell array in response to the first command, outputs the storage data through the data terminal or controls an impedance of the data terminal in response to the second command, performs the refresh operation on a predetermined number of the memory cells in a first period in response to an auto-refresh command, performs the refresh operation on the predetermined number of the memory cells in the first period and enters a self-refresh mode in response to a self-refresh command, and temporarily activates the DLL circuit to update a state thereof in connection with the self-refresh mode.

In another embodiment, there is provided a controller that includes a command issuing unit that issues at least a self-refresh command that causes a semiconductor device to enter a self-refresh mode in which a refresh operation on a predetermined number of memory cells included in memory cell array of the semiconductor device is performed, a self-refresh exit command that causes the semiconductor device to exit the self-refresh mode, an auto-refresh command that causes the semiconductor device to perform the refresh operation on the predetermined number of the memory cells, a power-down command that causes the semiconductor device to enter a power-down mode in which the semiconductor device reduces a power consumption thereof without performing the refresh operation, a power-down exit command that causes the semiconductor device to exit the power-down mode, and a first command that causes the semiconductor device to perform an access operation to storage data in the memory cell array. An interval of issuing the self-refresh commands is substantially the same as that of the auto-refresh commands. The command issuing unit issues the first command to the semiconductor device after elapse of a first period at earliest from issuing the power-down exit command, and issues the first command to the semiconductor device after elapse of a second period that is substantially the same time length as the first period at earliest from issuing the self-refresh exit command.

In still another embodiment, there is provided an information processing system that includes: a first device including a memory cell array that holds storage data, an access control circuit that performs an access operation to the memory cell array and controls a power consumption of the first device; a second device including a command issuing unit that issues a self-refresh command, a self-refresh exit command, an auto-refresh command, a power-down command, a power-down exit command, and a first command to the first device. The command issuing unit issues the first command to the first device after elapse of a first period at earliest from issuing the power-down exit command. The command issuing unit issues the first command to the first device after elapse of a second period that is substantially the same time length as the first period at earliest from issuing the self-refresh exit command. The first device enters a self-refresh mode in response to the self-refresh command and exits the self-refresh mode in response to the self-refresh exit command. The access control circuit performs a refresh operation of the storage data on a first number of memory cells included in the memory cell array during the self-refresh mode. The access control circuit performs the refresh operation of the storage data on the first number of memory cells in response to the auto-refresh command. The first device enters a power-down mode in response to the power-down command and exits the power-down mode in response to the power-down exit command. The access control circuit reduces the power consumption without performing the refresh operation during the power-down mode. The access control circuit performs the access operation to the memory cell array in response to the first command.

In still another embodiment, there is provided a control method of an information processing system having a controller and a semiconductor device. The method includes: issuing, from the controller to the semiconductor device, a self-refresh command, a self-refresh exit command, an auto-refresh command, a power-down command, a power-down exit command, and a first command, wherein the controller issues the first command to the semiconductor device after elapse of a first period at earliest from issuing the power-down exit command, and wherein the controller issues the first command to the semiconductor device after elapse of a second period that is substantially the same time length as the first period at earliest from issuing the self-refresh exit command; entering a self-refresh mode in which a refresh operation on a predetermined number of memory cells included in memory cell array of the semiconductor device is performed in response to the self-refresh command; exiting the self-refresh mode in response to the self-refresh exit command; performing a refresh operation on the predetermined number of the memory cells in response to the auto-refresh command; entering a power-down mode in which the semiconductor device reduces a power consumption thereof without performing the refresh operation; exiting the power-down mode in response to the power-down exit command; and performing an access operation to storage data in the memory cell array in response to the first command.

In still another embodiment, there is provided a control method of a controller, the method including: issuing a self-refresh command that causes a semiconductor device to enter a self-refresh mode in which a refresh operation on a predetermined number of memory cells included in memory cell array of the semiconductor device is performed; issuing a self-refresh exit command that causes the semiconductor device to exit the self-refresh mode; issuing an auto-refresh command that causes the semiconductor device to perform the refresh operation on the predetermined number of the memory cells; issuing a power-down command that causes the semiconductor device to enter a power-down mode in which the semiconductor device reduces a power consumption thereof without performing the refresh operation; issuing a power-down exit command that causes the semiconductor device to exit the power-down mode; and issuing a first command that causes the semiconductor device to perform an access operation to storage data in the memory cell array. An interval of issuing the self-refresh commands is substantially the same as that of the auto-refresh commands. The controller issues the first command to the semiconductor device after elapse of a first period at earliest from issuing the power-down exit command, and issues the first command to the semiconductor device after elapse of a second period that is substantially the same time length as the first period at earliest from issuing the self-refresh exit command.

According to the semiconductor device of the present invention, the number of memory cells to be refreshed in a refresh operation synchronous with the self-refresh command is equal to that of memory cells to be refreshed in a refresh operation synchronous with the auto-refresh command and a state of the DLL circuit is updated corresponding to the self-refresh mode. Therefore, the controller can issue a command a short time after issuance of the self-refresh exit command.

According to the controller and the control method thereof of the present invention, respective intervals of self-refresh and auto-refresh of refreshing a first number of storage data in the semiconductor device and performing timings thereof can be managed independently on the side of the controller. Accordingly, the controller can issue a row command a short time after issuance of the self-refresh exit command, as the power-down exit command.

According to the information processing system and the control method thereof of the present invention, the self-refresh command the auto-refresh command are used to refresh the same number of storage data, and thus performing timings of the refresh operation on the side of the semiconductor device can be known by the controller. Accordingly, the controller can issue a row command a short time after issuance of the self-refresh exit command, as the power-down exit command.

BRIEF DESCRIPTION OF THE DRAWINGS

FIG. 4 is a list of commands indicated by command signals CMD and a clock enable signal CKE;

FIGS. 21A to 21D are tables for explaining impedance controls for respective ranks, in which FIG. 21A shows a case where a write operation is performed for the DIMM 401, FIG. 21B shows a case where a write operation is performed for the DIMM 402, FIG. 21C shows a case where a read operation is performed for the DIMM 401, and FIG. 21D shows a case where a read operation is performed for the DIMM 402.

DETAILED DESCRIPTION OF THE EMBODIMENTS

A representative embodiment of the present invention is that the refresh operation is performed in response to the self-refresh command, for example, the same number of times (once) as that the refresh operation is performed in response to the auto-refresh command and that state update of the DLL circuit is performed in response to the self-refresh exit command. Therefore, an internal oscillator that realizes a period in asynchronism with outside is not used during the self-refresh. Accordingly, when the self-refresh command and the self-refresh exit command are periodically and alternately issued from the controller, a row command or a command requiring an internal clock signal phase-controlled can be issued a short time after issuance of the self-refresh exit command.

While the auto refresh and the self refresh of the present application are the same in that both refresh in synchronism with outside, they are different in power consumption or specifications of interface during the refresh. The consumption current in the self refresh is lower than that in the auto refresh. This is because the controller stops issuance of the external clock signal as a synchronization signal (which is a system clock for a memory buss and also referred to as "external synchronization signal"). In the semiconductor device, more clock buffers (input buffer circuits) that communicate with outside can be inactivated at the time of self refresh, so that power of internal circuits not related to the refresh in the semiconductor device can be controlled to be smallest. From the viewpoint of interface, impedance controls of the data terminal that outputs data are different, for example. In principle, the impedance control cannot be performed at the time of self refresh while it is possible at the time of auto refresh.

Figure 1:
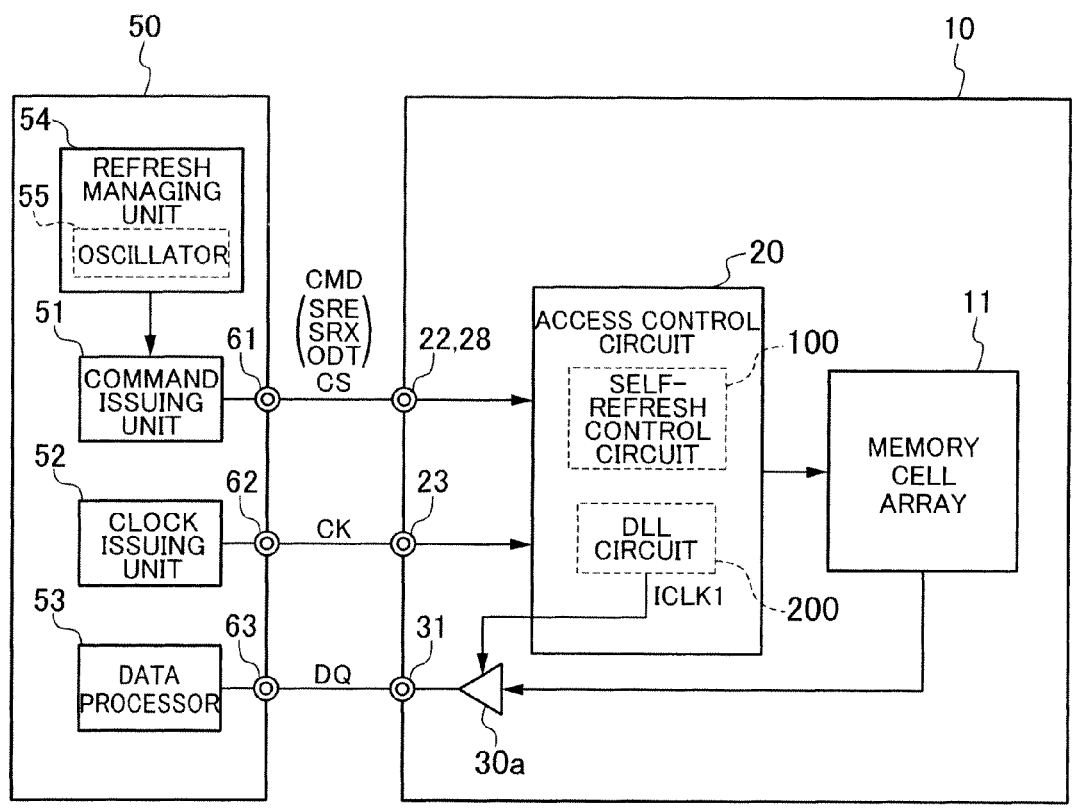
FIG. 1 is a schematic diagram for explaining an embodiment of the present invention.

Referring now to FIG. 1, it shows an information processing system including a controller 50 and a semiconductor device 10. The semiconductor device 10 includes a command terminal 22, a clock terminal 23, and a data terminal 31, which are connected to a command terminal 61, a clock terminal 62, and a data terminal 63 included in the controller 50, respectively. The command terminal 22 includes a chip select terminal 28 which will be explained later. The controller 50 includes a command issuing unit 51 that issues a command CMD, a clock issuing unit 52 that issues an external clock signal CK, a data processor 53 that processes storage data DQ, and a refresh managing unit 54 that manages a refresh operation. The refresh managing unit 54 includes an oscillator 55 that periodically alternately issues a self-refresh command SRE and a self-refresh exit command SRX. The command terminal 22 includes a plurality of control pins (not shown), and plural commands (first and second commands, for example), which will be explained later, are defined by corresponding logical combinations of plural control signals. In the present invention, an external clock signal having a predetermined frequency is also preferred to as "synchronization signal" or "external synchronization signal" The controller 50 does not need to be configured with one chip and, for example, the clock issuing unit 52 and the other units can be configured with separate chips.

The semiconductor device 10 includes a memory cell array 11 that holds storage data, an output buffer circuit 30a that outputs the storage data read from the memory cell array 11 in synchronism with an internal clock signal ICLK1, and an access control circuit 20 that performs an access to the memory cell array 11. The access control circuit 20 includes a self-refresh control circuit 100 and a DLL circuit 200. The self-refresh control circuit 100 controls the memory cell array 11 and the DLL circuit 200 based on the self-refresh command SRE and the self-refresh exit command SRX. The DLL circuit 200 generates the internal clock signal ICLK1 phase-controlled, based on the external clock signal CK.

The command CMD issued by the controller 50 includes a self-refresh command SRE for entering the self-refresh mode, a self-refresh exit command SRX for exiting the self-refresh mode and the like, in addition to a row command and a column command.

Figure 2:
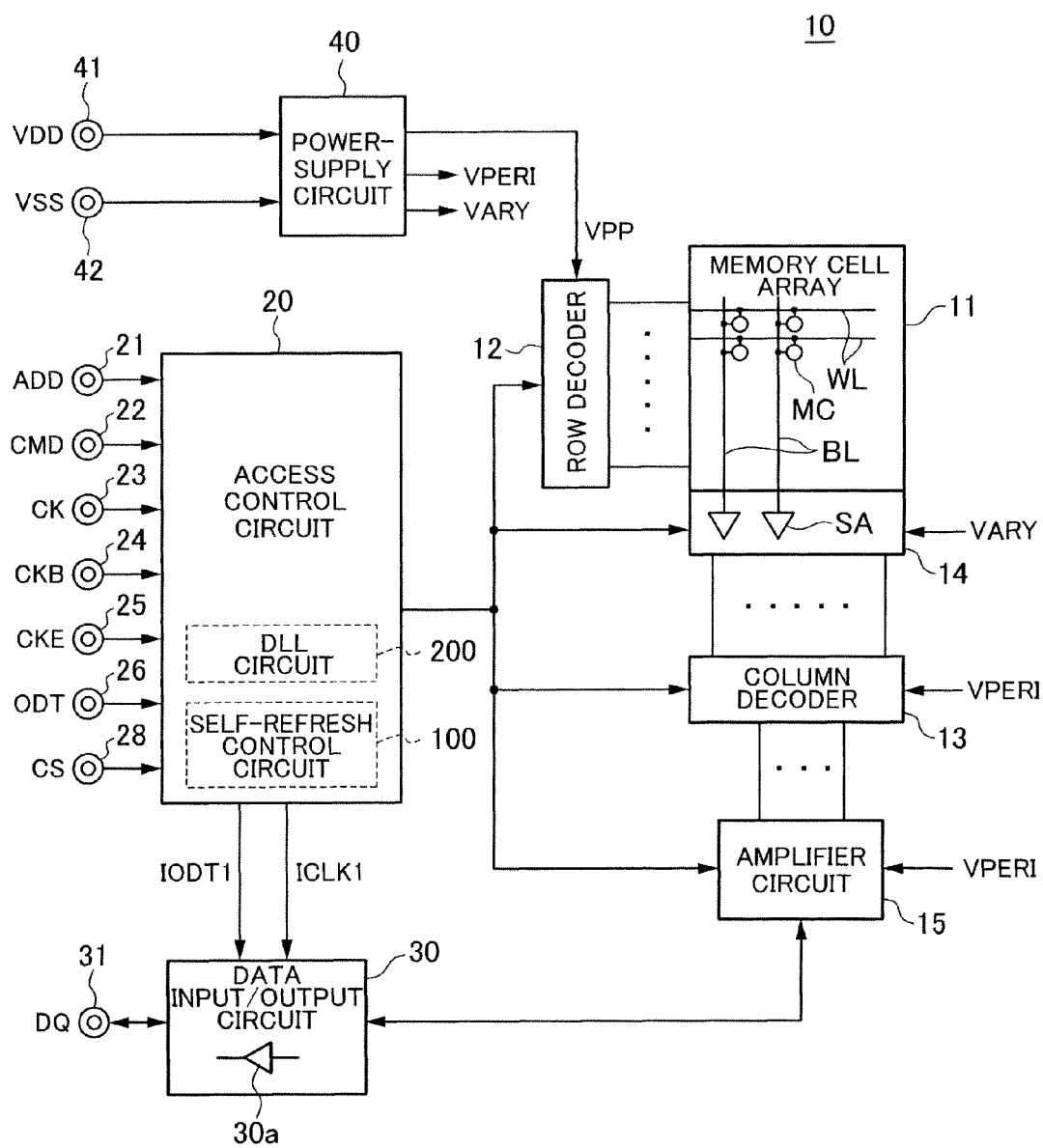
FIG. 2 is a block diagram indicative of an embodiment of a general configuration of a semiconductor device 10 according to a first embodiment of the present invention.

The row command causes the access control circuit 20 to perform an access to the memory cell array 11 based on a row address and corresponds to an active command ACT, an auto-refresh command REF and the like. In the present invention, these commands are also referred to as "first commands". On the other hand, the column command causes the access control circuit 20 to control a state of the data terminal 31 based on a column address and corresponds to a read command RD, a write command WT and the like. As shown in FIG. 2 explained later, when the read command RD is issued, data in an amplifier circuit 15 is output to outside through the data terminal 31. When the write command WT is issued, data supplied from outside is supplied to the amplifier circuit 15 through the data terminal 31. Although not relevant to the column address, an impedance control signal ODT used by the access control circuit 20 to control an impedance of the data terminal 31 also belongs to the column command. Among these commands, the read command RD and the impedance control signal ODT are commands for controlling a state of the data terminal 31 in synchronism with the internal clock signal ICLK1 and these commands are also referred to as "second commands" in the present invention.

The information processing system shown in FIG. 1 has first and second operation modes. The first operation mode is compliant with DRHM standards (JEDEC (Joint Electron Device Engineering Council) Solid State Technology Association), and the second operation is different from the DRAM standards. In either case where the information processing system is set to the first or second operation mode, the semiconductor device 10 enters the self-refresh mode when the self-refresh command SRE is issued from the controller 50 to the semiconductor device 10 and exits the self-refresh mode when the self-refresh exit command SRX is issued. However, operations performed by the controller 50 and the semiconductor device 10 during the self-refresh mode differ between the first and second operation modes.

In a case where the first operation mode is set, when the semiconductor device 10 enters the self-refresh mode, the access control circuit 20 periodically performs the refresh operation in asynchronism with outside by using an internal oscillator (not shown). Therefore, a performing timing of the refresh operation is in asynchronism with the external clock signal CK. Accordingly, when issuance of the self-refresh exit command SRX and an asynchronous refresh operation overlap, the latter has a priority. When the semiconductor device 10 enters the self-refresh mode, the DLL circuit 200 is inactivated and power consumption is reduced. When the DLL circuit 200 is inactivated, update information that is held until then is discarded. This is because it is preferable that the DLL circuit 200 performs a cold start in conjunction with issuance of the self-refresh exit command SRX without referring to previous update information when the controller changes a frequency of the external clock signal CK during the self-refresh mode. The DLL circuit 200 is brought into a locked state by plural times of updating. The update information and lock will be explained later.

On the other hand, in a case where the second operation mode is set, when the semiconductor device 10 enters the self-refresh mode, the self-refresh control circuit 100 performs the refresh operation only once. Unlike the first operation mode, periodical refresh operation using the oscillator is not performed. During a period when the semiconductor device 10 has entered the self-refresh mode, the clock issuing unit 52 included in the controller 50 in principle stops issuance of the external clock signal CK. Stop means that the external clock signal CK keeps a high or low state without oscillating, or has a high impedance. When the self-refresh exit command SRX is issued, the DLL circuit 200 is temporarily activated and phase states of the external clock signal CK and the internal clock signal ICLK1 in the semiconductor device are updated. At that time, the DLL circuit 200 is not reset and the update information is maintained. Therefore, only a previous state is updated (a subsequent update value is determined based on a previous update value). Accordingly, a time required for the DLL circuit 200 to be locked (for the phases of the external clock signal CK and the internal clock signal ICLK1 in the semiconductor device to be almost matched with each other) after the DLL circuit 200 is activated in response to issuance of the self-refresh exit command SRX is quite short. During a period when the DLL circuit 200 is activated, the external clock signal CK is issued from the clock issuing unit 52 included in the controller 50. That is, the external clock signal CK is issued from the clock issuing unit 52 only corresponding to a period when the DLL circuit 200 is activated.

In the second operation mode, the self-refresh command SRE and the self-refresh exit command SRX are periodically and alternately issued with a predetermined period under a control by the refresh managing unit 54. It is preferable that the predetermined period in the oscillator 55 be equal to an operation period of the refresh operation using the internal oscillator in the semiconductor device in the first operation mode. This means that the semiconductor device 10 alternately performs a refresh operation in response to the self-refresh command SRE and the update operation of the DLL circuit 200 in response to the self-refresh exit command SRX. As a result, at a time when the semiconductor device 10 exits the self-refresh mode, a state where no refresh operation is performed (issuance of the self-refresh exit command SRX and an asynchronous refresh operation do not overlap with each other) is ensured and thus the controller 50 can issue the first command for accessing the memory cell array 11 a short time after issuance of the self-refresh exit command SRX. Furthermore, because the state update of the DLL circuit 200 is performed in response to the self-refresh exit command SRX, the second command using the internal clock signal ICLK1 can be issued a short time after issuance of the self-refresh exit command SRX.

Preferred embodiments of the present invention will be explained below in detail with reference to the accompanying drawings.

Turning to FIG. 2, the semiconductor device 10 according to the present embodiment is a DRAM and includes the memory cell array 11. The semiconductor device 10 is mainly constituted by an N-channel transistor and a P-channel transistor. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA. As explained later, the memory cell array 11 is divided into eight banks.

Operations of the row decoder 12, the column decoder 13, the sense circuit 14, and the amplifier circuit 15 are controlled by the access control circuit 20. An address signal ADD, the command signal CMD, external clock signals CK and CKB, a clock enable signal CKE, the impedance control signal ODT, and a chip select signal CS are supplied to the access control circuit 20. These signals are input from outside through corresponding terminals 21 to 26 and 28. The external clock signals CK and CKB are synchronization signals complementary to each other. The chip select signal CS is used by the controller 50 to select the semiconductor device (the access control circuit 20). The access control circuit controls the row decoder 12, the column decoder 13, the sense circuit 14, the amplifier circuit 15, and a data input/output circuit 30 based on these signals.

Specifically, when the command signal CMD indicates the active command ACT, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing. This operation is also referred to as "access to storage data" and a command for performing this operation is also referred to as "first command".

When the command signal CMD indicates the read command RD or the write command WT, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit and the sense amplifier SA. This operation is also referred to as "output of storage data" and a command for performing this operation is also referred to as "second command".

When the command signal CMD indicates the auto-refresh command REF, the access control circuit 20 supplies a count value (refresh address) of a refresh counter (not shown) to the row decoder 12. In response thereto, the row decoder 12 selects a word line WL indicated by the refresh address and accordingly memory cells MC connected to the selected word line WL are refreshed by the sense amplifiers SA. This operation is also referred to as "access to storage data" and a command for performing this operation is also referred to as "first command".

Furthermore, when the command signal CMD indicates the self-refresh command SRE, a self-refresh control circuit 100 included in the access control circuit 20 starts to cause the semiconductor device 10 to enter the self-refresh mode. When the command signal CMD indicates the self-refresh exit command SRX, the semiconductor device 10 exits the self-refresh mode.

As shown in FIG. 2, the access control circuit 20 includes the DLL circuit 200. The DLL circuit 200 receives the external clock signals CK and CKB and generates the internal clock signal ICLK1 phase-controlled, based on the received signal. The DLL circuit 200 includes a delay circuit (corresponding to reference numeral 210 in FIG. 7) that delays the external clock signals CK and CKB, a delay adjusting circuit (corresponding to 220 and 250 in FIG. 7) that adjusts a delay amount of the delay circuit, and a phase comparing circuit (corresponding to 240 in FIG. 7) that compares phases of the internal clock signal ICLK1 output from the delay circuit and the external clock signals CK and CKB, and supplies a result of the comparison to the delay circuit. The internal clock signal ICLK1 is supplied to the output buffer circuit 30*a* included in the data input/output circuit 30 and accordingly read data DQ that are read from the memory cell array 11 are output from the data terminal 31 in synchronism with the internal clock signal ICLK1. An impedance control signal IODT1 is also supplied to the data input/output circuit 30. When the impedance control signal IODT1 is activated, the output buffer circuit 30*a* is brought into a predetermined state and accordingly the data terminal 31 is controlled to have a predetermined impedance. This operation is also referred to as "control of an impedance of the data terminal" and a command for performing this operation is also referred to as "second command".

These circuit blocks use predetermined internal voltages as operating power. These internal voltages are generated by a power-supply circuit 40 shown in FIG. 2. The power-supply circuit 40 receives an external potential VDD and a ground potential VSS supplied through power-supply terminals 41 and 42, respectively, and generates internal voltages VPP, VPERI, VARY and the like based on these potentials. The internal voltage VPP is generated by increasing the external potential VDD and the internal voltages VPERI and VARY are generated by decreasing the external potential VDD. The power-supply circuit 40 also generates a negative voltage (not shown).

The internal voltage VPP is mainly used by the row decoder 12. The row decoder 12 drives a word line WL selected based on the address signal ADD to a VPP level, thereby bringing cell transistors included in the memory cells MC into conduction. The internal voltage VARY is mainly used by the sense circuit 14. When activated, the sense circuit 14 drives one of paired bit lines to a VARY level and the other bit line to a VSS level, thereby amplifying read data that have been read. The internal voltage VPERI is used as an operating voltage for most of peripheral circuits such as the access control circuit 20. Power consumption of the semiconductor device 10 is reduced by using the internal voltage VPERI lower than the external voltage VDD as the operating voltage for these peripheral circuits.

Figure 3:
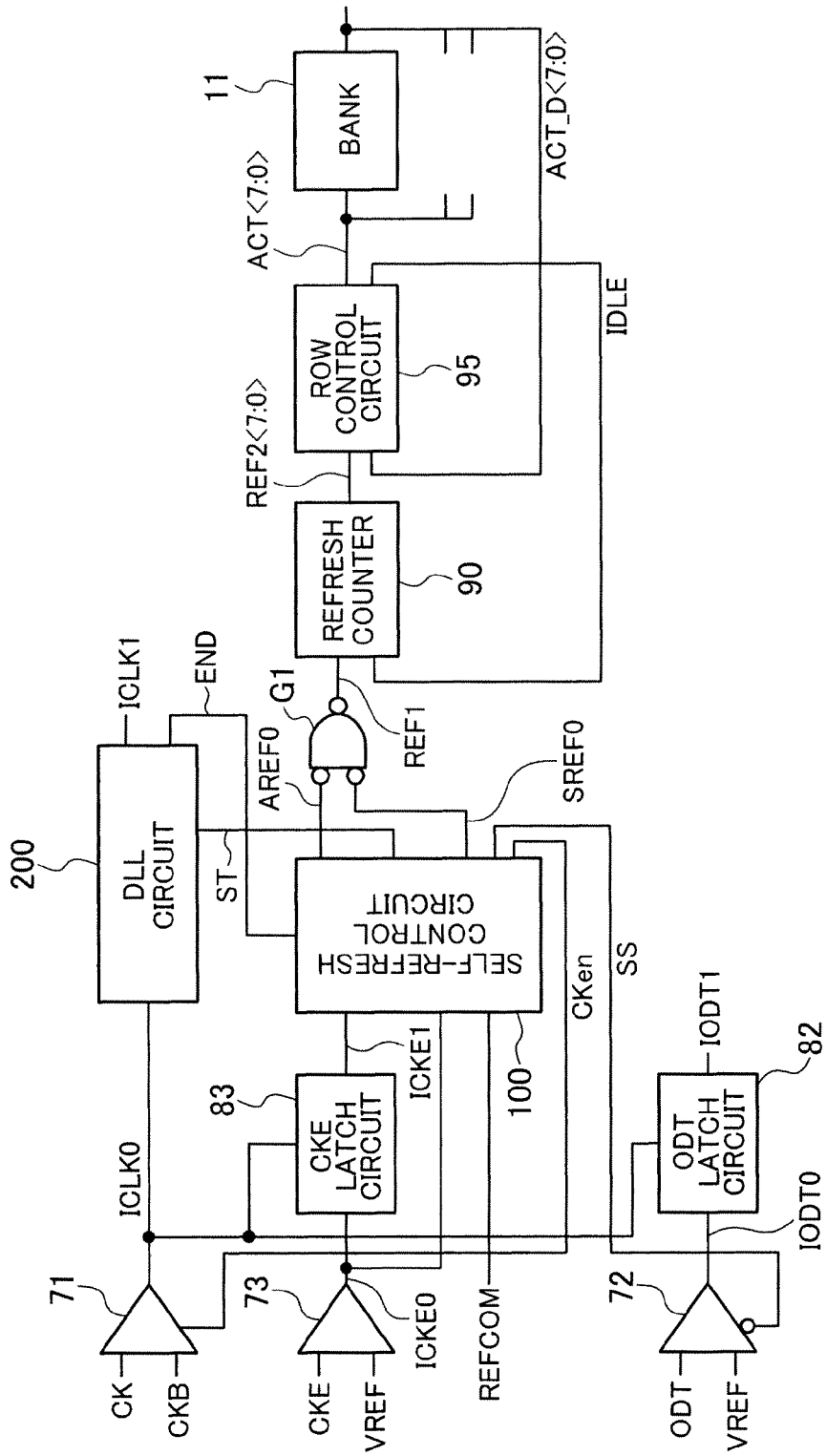
FIG. 3 is a block diagram indicative of an embodiment of main circuit blocks included in an access control circuit and shows a first embodiment of the present invention.

Turning to FIG. 3, the access control circuit 20 includes input buffer circuits 71 to 73. The input buffer circuit 71 receives the external clock signals CK and CKB and generates the internal clock signal ICLK0, and is also referred to as "first input buffer circuit" in the present invention. The input buffer circuit 72 receives the impedance control signal ODT and generates an impedance control signal IODT0, and is also referred to as "second input buffer circuit" in the present invention. The input buffer circuit 73 receives the clock enable signal CKE and generates a clock enable signal ICKE0, and is also referred to as "third input buffer circuit" in the present invention. The input buffer circuits 71 and 72 are activated or inactivated according to an enable signal CKen and a self-state signal SS, respectively. The input buffer circuit 71 is activated when the enable signal CKen is high. The input buffer 72 is activated when the self-state signal SS is low. On the other hand, the input buffer circuit 73 is always activated. This is because the self-refresh exit command SRX is indicated by the clock enable signal CKE and thus the input buffer circuit 73 needs to be activated also in the self-refresh mode. The self-refresh command SRE is indicated by the command CMD input through the command terminal 22 and the clock enable signal CKE input through the clock enable terminal 25.

Turning to FIG. 4, each command is represented by a combination of the command signals CMD and a logic level of the clock enable signal CKE. In FIG. 4, "H" denotes a high level, "L" denotes a low level, and "–" denotes "Don't care". Furthermore, "CSB", "RASB", "CASB", and "WEB" denote a chip select signal, a row-address strobe signal, a column-address strobe signal, and a write enable signal, respectively.

These signals CSB, RASB, CASB, and WEB are signals constituting the command signals CMD.

Specifically, when the signals CSB, RASB, and CASB are set to a low level (L) and the signal WEB is set to a high level (H) with the clock enable signal CKE kept at a high level (H), this is handled as the auto-refresh command REF. When the clock enable signal CKE is changed from the high level (H) to a low level (L) with the signals CSB, RASB, and CASB set at the low level (L) and the signal WEB set at the high level (H), this is handled as the self-refresh command SRE. When the clock enable signal CKE is changed from the high level (H) to the low level (L) with the signal CSB set at the low level (L) and the signals RASB, CASB, and WEB set at the high level (H), this handled as a power-down command PDE. When the clock enable signal CKE is changed from the low level (L) to the high level (H) with the signal CSB set at the high level (H), this is handled as the self-refresh exit command SRX or a power-down exit command PDX.

The internal clock signal ICLK0 output from the input buffer circuit 71 is supplied to the DLL circuit 200. The DLL circuit 200 generates the internal clock signal ICLK1 phase-controlled, based on the internal clock signal ICLK0. Operation states of the DLL circuit 200 include a first active state, a second active state, and an inactive state, details of which will be explained later.

The first active state is an operation state where the delay circuit, the delay adjusting circuit, and the phase comparing circuit are active and thus the internal clock signal ICLK1 phase-controlled is continuously generated, and the DLL circuit 200 is brought into this operation state when a read command and the impedance control signal ODT are issued. Therefore, the internal clock signal ICLK1 generated in the first active state is supplied to the output buffer circuit 30a shown in FIG. 2. The second active state is an operation state where the internal clock signal ICLK1 phase-controlled is generated at a predetermined time interval, and the delay circuit, the delay adjusting circuit, and the phase comparing circuit are activated at the predetermined time interval. This is an update operation of confirming phases of the internal clock signal ICLK1 and the external clock signals CK and CKB at the predetermined time interval to eliminate phase shifting due to temperature or voltage changes. Specifically, this is an operation of updating information of the delay amount provided by the delay adjusting circuit to the delay circuit at the predetermined time interval. Therefore, the internal clock signal ICLK1 generated in the second active state does not need to be supplied to the output buffer circuit 30a shown in FIG. 2. The inactive state is a state where the delay circuit, the delay adjusting circuit, and the phase comparing circuit are inactive and accordingly the internal clock signal ICLK1 is not generated. However, information of the counter circuit 220 that holds update information included in the delay adjusting circuit is held.

In the first embodiment, the DLL circuit 200 is brought into the second active state in response to the self-refresh exit command SRX. Transition from the inactive state to the second active state is triggered by an update start signal ST. When the update operation is completed, the DLL circuit 200 outputs an update end signal END.

The impedance control signal IOCDT0 supplied from the input buffer circuit 72 is latched by an ODT latch circuit 82. The ODT latch circuit 82 latches the impedance control signal IODT0 in synchronism with the internal clock signal ICLK0, and the impedance control signal IODT1 output from the ODT latch circuit 82 is supplied to the data input/output circuit 30 shown in FIG. 2.

The clock enable signal ICKE0 output from the input buffer circuit 73 is latched by a CKE latch circuit 83. The CKE latch circuit 83 latches the clock enable signal ICKE0 in synchronism with the internal clock signal ICLK0, and a clock enable signal ICKE1 output from the CKE latch circuit 83 is supplied to the self-refresh control circuit 100.

The self-refresh control circuit 100 is a circuit block that receives the clock enable signals ICKE0 and ICKE1, a refresh command REFCOM, and the update end signal END and generates various internal signals. The refresh command REFCOM is common to the auto-refresh command REF and the self-refresh command SRE included in the command signal CMD. The refresh command REFCOM is a signal that is activated when either the auto-refresh command REF or the self-refresh command SRE is issued. The internal signals generated by the self-refresh control circuit 100 include an auto-refresh signal AREF0, the self-refresh signal SREF0, the enable signal CKen, the self state signal SS, and the update start signal ST. A specific circuit configuration of the self-refresh control circuit 100 is explained later.

As shown in FIG. 3, the auto-refresh signal AREF0 and the self-refresh signal SREF0 are supplied to an OR gate circuit G1, and a refresh signal REF1 output therefrom is supplied to a refresh counter 90. The refresh counter 90 generates eight refresh signals REF2<7:0> with a small shift from each other eight consecutive times in a time sequence, respectively, in response to a plurality of toggles of the refresh signal REF1 and an idle signal IDLE. In the first embodiment, the memory cell array 11 is divided into eight banks and the refresh signals REF2<7:0> are used as refresh signals for corresponding banks <7:0>, respectively. That is, the idle signal IDLE is toggled seven times in response to one refresh signal REF1, so that each of the eight refresh signals REF2<7:0> is generated eight times in a row, thereby selecting 64 word lines.

The refresh signals REF2<7:0> are supplied to a row control circuit 95. The row control circuit 95 includes an address counter that has a refresh address stored therein and, when the refresh signals REF2<7:0> are activated, outputs the refresh address together with active signals ACT<7:0> to the corresponding banks <7:0>, respectively. When the active signals ACT<7:0> are activated, a word line indicated by the refresh address is accessed in the corresponding banks <7:0>, respectively. Delayed active signals ACT_D<7:0> are then fed back from the corresponding banks <7:0>, respectively, to the row control circuit 95, so that a next refresh address is supplied. The row control circuit 95 receives the delayed active signals ACT_D<7:0> and outputs the idle signal IDLE to the refresh counter 90. The refresh counter 90 increases a count value in response to the idle signal IDLE and generates the eight refresh signals REF2<7:0> again with a small shift with each other. Refresh of the banks <7:0> is performed by a staggered operation. This routine is repeated eight times. By repeating this operation a predetermined number of times (eight times, for example), eight word lines are selected in each of the banks <7:0> in a time sequence. In this way, a refresh operation for memory cells MC connected to a total of the 64 word lines is completed. That is, internal refresh is performed 64 times in a time sequence in response to activation of one refresh signal REF1.

Figure 5:
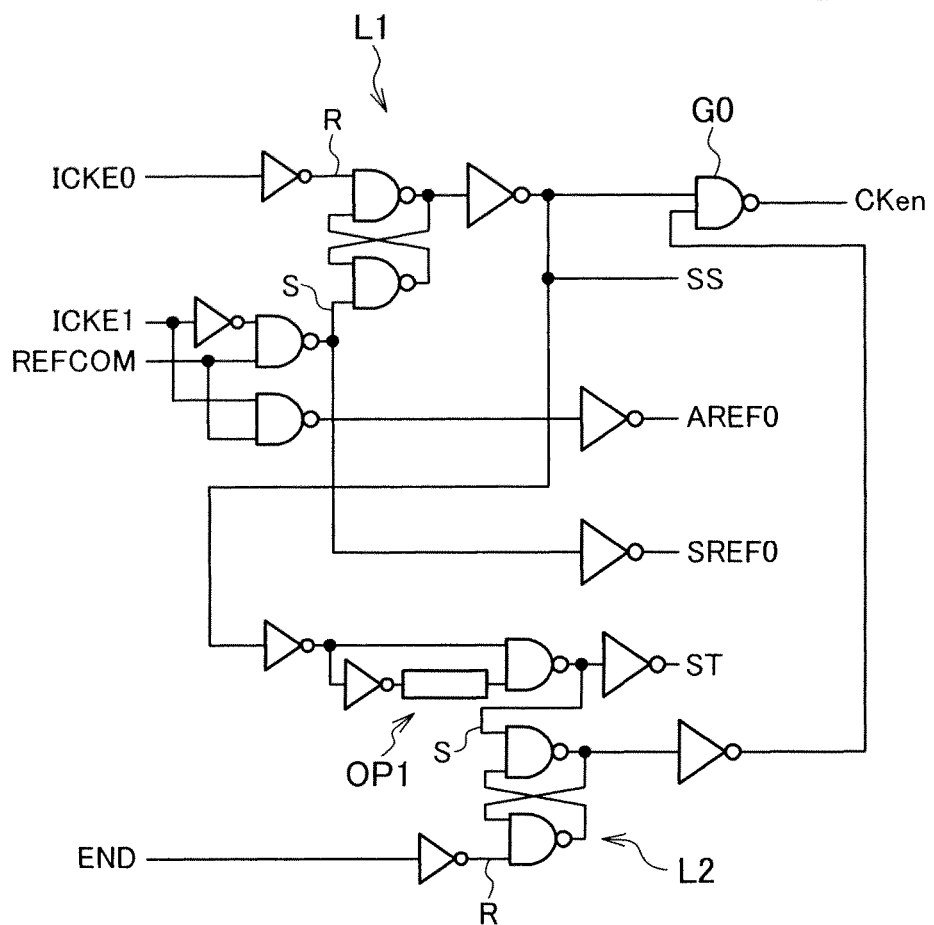
FIG. 5 is a main circuit diagram of indicative of an embodiment of a self-refresh control circuit 100.

Turning to FIG. 5, the self-refresh control circuit 100 includes SR latch circuits L1 and L2. Although the self-refresh control circuit 100 does not include an oscillator for self-refresh, it is desirable that the self-refresh control circuit 100 include an oscillator for self-refresh to enable an operation compliant with the DRAM standards, as will be explained later. The SR latch circuits L1 and L2 both include a set node S and a reset node R and are set or reset when a low-level signal is input to the corresponding node.

To explain specifically, a signal indicating a negative AND of an inverse signal of the clock enable signal ICKE1 and the refresh command REFCOM is input to the set node S of the SR latch circuit L1. On the other hand, an inverse signal of the clock enable signal ICKE0 is input to the reset node R of the SR latch circuit L1. This causes the SR latch circuit L1 to be set when the clock enable signal ICKE1 has a low level and the refresh command REFCOM has a high level and to be reset when the clock enable signal ICKE0 has a high level. The clock enable signal ICKE1 has the low level and the refresh command REFCOM has the high level when the self-refresh command SRE is issued, and the clock enable signal ICKE0 has the high level when the self-refresh exit command SRX is issued. This means that the SR latch circuit L1 is set when the self-refresh command SRE is issued and reset when the self-refresh exit command SRX is issued. The SR latch circuit L1 outputs the self-state signal SS, which is supplied to the input buffer circuit 72 shown in FIG. 3.

A signal supplied to the set node S of the SR latch circuit L1 is used as the self-refresh signal SREF0 as it is. The self-refresh signal SREF0 is supplied to the OR gate circuit G1 shown in FIG. 3. Accordingly, the refresh operation is performed each time the self-refresh command SRE is issued. Further, the clock enable signal ICKE1 has the high level and the refresh command REFCOM has the high level when the auto-refresh command REF is issued, and a signal indicating an AND of the clock enable signal ICKE1 and the refresh command REFCOM is used as the auto-refresh signal AREF0. The auto-refresh signal AREF0 is also supplied to the OR gate circuit G1 shown in FIG. 3.

The self-state signal SS is supplied also to the one-shot pulse generating circuit OP1. The one-shot pulse generating circuit OP1 activates the update start signal ST in response to change of the self-state signal SS from a high level to a low level. This means that the update operation of the DLL circuit 200 is started each time the self-refresh exit command SRX is issued.

An output signal of the one-shot pulse generating circuit OP1 is supplied to the set node S of the SR latch circuit L2. An inverted signal of the update end signal END is input to the reset node R of the SR latch circuit L2. This causes the SR latch circuit L2 to be set each time the self-refresh exit signal SRX is issued. Furthermore, outputs of the SR latch circuits L1 and L2 are supplied to a NAND gate circuit G0, and an output thereof is used as the enable signal CKen. Therefore, the enable signal CKen has a low level when the SR latch circuit L1 is set and the SR latch circuit L2 is reset. In other states, the enable signal CKen is always activated to a high level.

Figure 6:
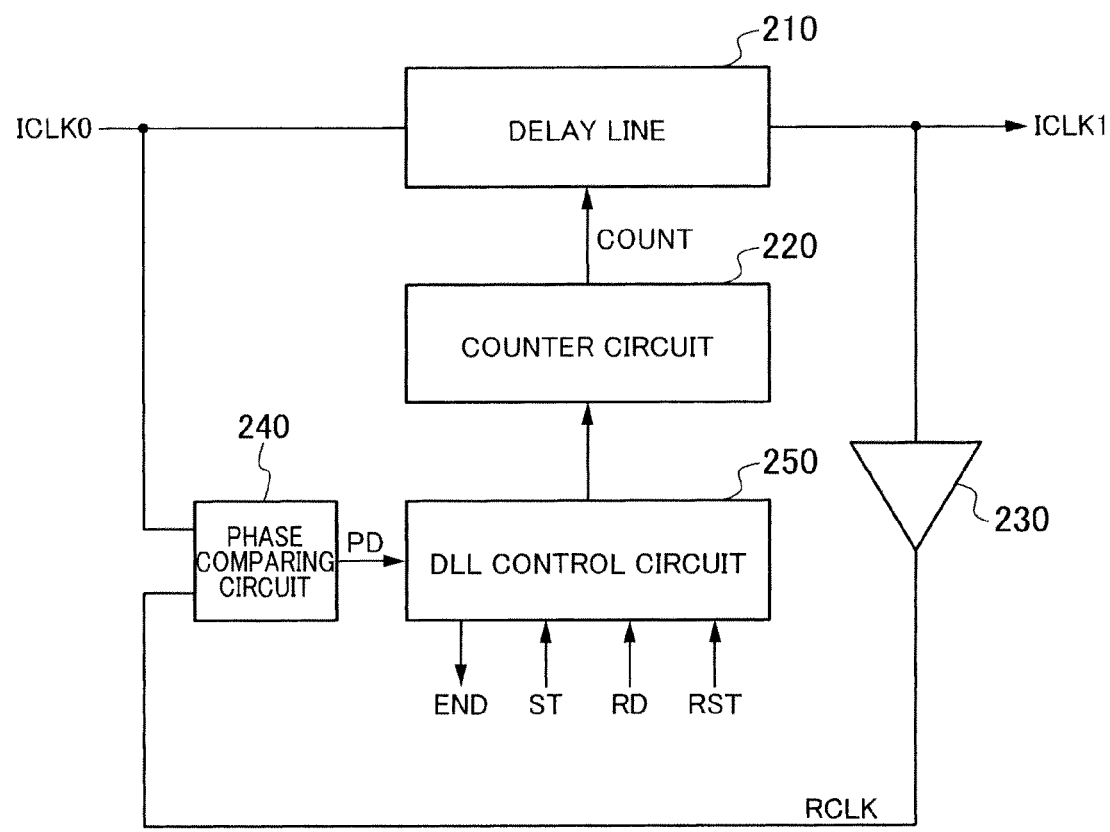
FIG. 6 is a block diagram indicative of an embodiment of a configuration of a DLL circuit 200.

Turning to FIG. 6, the DLL circuit 200 includes a delay line 210 that delays the internal clock signal ICLK0 to generate the internal clock signal ICLK1. The delay line 210 is a circuit that generates the internal clock signal ICLK1 by providing a delay corresponding to a count value COUNT of the counter circuit 220 to the internal clock signal ICLK0.

The internal clock signal ICLK1 is supplied to the output buffer circuit 30a shown in FIG. 2 and is supplied also to a replica buffer circuit 230. The replica buffer circuit 230 generates an internal clock signal RCLK as a replica based on the internal clock signal ICLK1 and has the same characteristics as the output buffer circuit 30a. Because the output buffer circuit 30a outputs read data DQ in synchronism with the internal clock signal ICLK1, the internal clock signal RCLK output from the replica buffer circuit 230 is precisely synchronized with the read data DQ. In a DRAM, read data DQ needs to be precisely synchronized with the external clock signals CK and CKB and, when phase shifting occurs therebetween, the phase shifting needs to be detected and corrected. This detection is performed by the phase comparing circuit 240 and a result thereof is fed back to the counter circuit 220 through a DLL control circuit 250 to correct the phase shifting.

The phase comparing circuit 240 compares phases of the internal clock signal ICLK0 and the internal clock signal RCLK with each other and generates a phase determination signal PD based on a comparison result. The internal clock signal ICLK0 has the same timing as the external clock signals CK and CKB, and the internal clock signal RCLK has the same timing as read data DQ, which implies that the phase comparing circuit 240 indirectly compares phases of the external clock signals CK and CKB and the read data DQ with each other. When the comparison result indicates that the internal clock signal RCLK is behind the internal clock signal ICLK0, the phase determination signal PD is set to one of logic levels (a low level, for example). In response thereto, the DLL control circuit 250 counts down a count value of the counter circuit 220, thereby reducing a delay amount of the delay line 210. Conversely, when the internal clock signal RCLK is ahead of the internal clock signal ICLK0, the phase determination signal PD is set to the other logic level (a high level, for example). In response thereto, the DLL control circuit 250 counts up a count value of the counter circuit 220, thereby increasing a delay amount of the delay line 210. When phases of the internal clock signal ICLK0 and the internal clock signal RCLK are aligned with each other by periodically repeating this operation, phases of the read data DQ and the external clock signals CK and CKB are consequently aligned with each other.

The operation of the DLL control circuit 250 is controlled by a read signal RD, the update start signal ST, and the reset signal RST. The read signal RD is activated when a read command is issued and the DLL control circuit 250 continues the update operation of the counter circuit 220 while the read signal RD is activated. This corresponds to the first active state mentioned above and the internal clock signal ICLK1 phase-controlled is continuously generated. On the other hand, the update start signal ST is generated by the self-refresh control circuit 100 shown in FIG. 5 and, when the update start signal ST is activated, the DLL control circuit 250 performs the update operation of the counter circuit 220 for a predetermined period or a predetermined number of times. This corresponds to the second active state mentioned above and is performed to eliminate phase shifting caused by temperature or voltage changes. After the update operation of the counter circuit 220 is performed for the predetermined period or the predetermined number of times and thus the internal clock signal ICLK1 acquires a desired phase, the DLL control circuit 250 generates the update end signal END. At that time, the counter circuit 220 is not reset and transits to an inactive state with a count value at the time of generation of the update end signal END kept. Therefore, when the update start signal ST is periodically performed, the internal clock signal ICLK1 phase-controlled can be promptly generated when the read signal RD is issued.

The reset signal RST is activated when the DLL circuit 200 is to be entirely initialized. When the reset signal RST is activated, the count value of the counter circuit 220 is reset to an initial value and then the DLL circuit 200 is activated until the internal clock signal ICLK1 phase-controlled is generated. That is, previous update information is electrically discarded. Therefore, once the reset signal RST is activated, a certain time is required to enable output of the internal clock signal ICLK1 phase-controlled. The reset signal RST is automatically generated within the semiconductor device 10 and activated also when a reset command is issued from the controller 50.

The circuit configuration of the access control circuit 20 according to the first embodiment is as described above. An operation of the access control circuit 20 according to the first embodiment is explained next.

Figure 7:
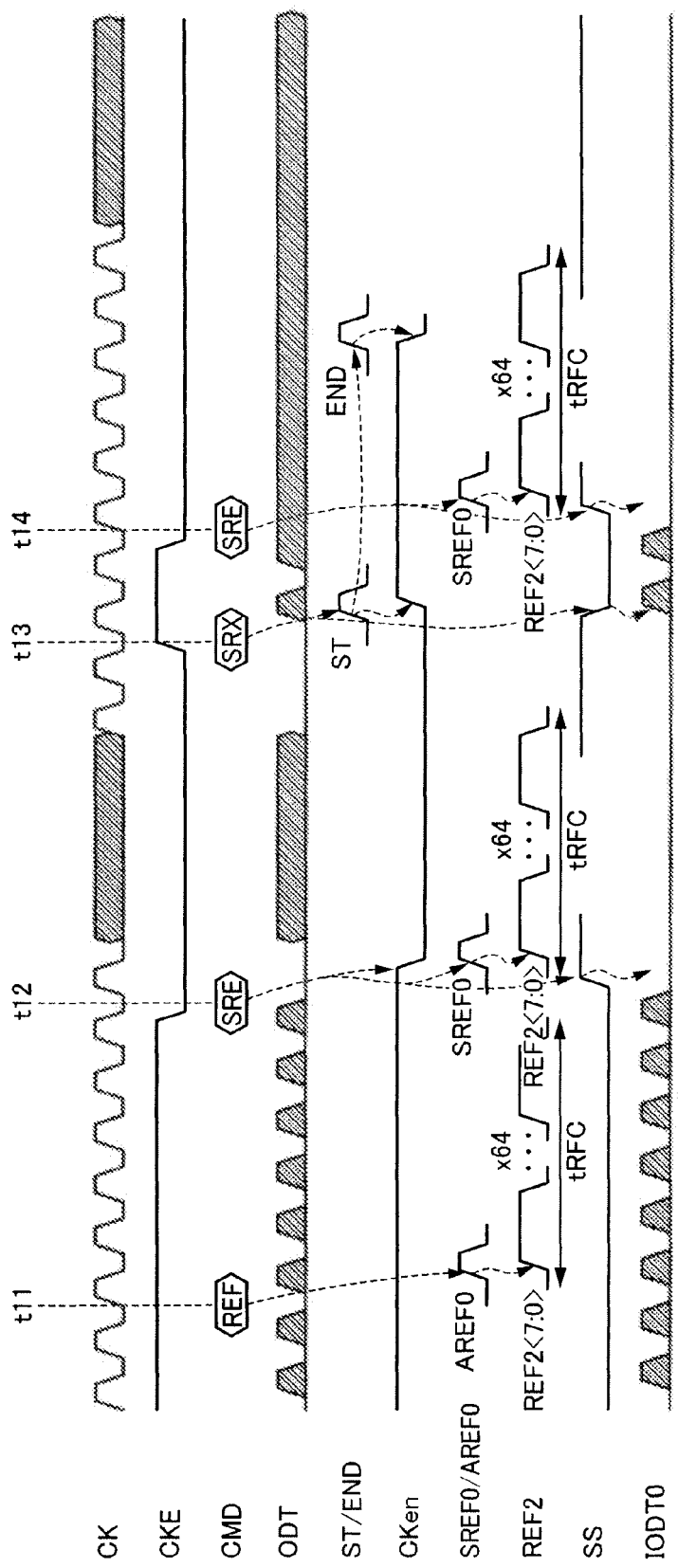
FIG. 7 is a timing chart for explaining an operation of the access control circuit 20 shown in FIG. 3.

Turning to FIG. 7, the auto-refresh command REF is issued at a time t11, the self-refresh command SRE is issued at a time t12, the self-refresh exit command SRX is issued at a time t13, and the self-refresh command SRE is issued again at a time t14. Therefore, the semiconductor device 10 is in the self-refresh mode during a period of time from t12 to t13 and a period after the time t14, and the semiconductor device is not in the self-refresh mode during other periods. Although not shown in FIG. 7, the self-refresh command SRE and the self-refresh exit command SRX are periodically and alternately issued during a period after a time t12, and such a control is executed when the controller 50 causes the semiconductor device to enter a pseudo self-refresh mode. The pseudo self-refresh mode is an operation mode to realize low power consumption as in the case where a DRAM compliant with the standards has entered the self-refresh mode, by periodically and alternately issuing the self-refresh command SRE and the self-refresh exit command SRX. Accordingly, during a period when the semiconductor device has entered the pseudo self-refresh mode, other commands such as the first and second commands are not issued during a period after the self-refresh exit command SRX is issued and before the next self-refresh command SRE is issued. In the pseudo self-refresh mode, the self-refresh command SRE is issued immediately after issuance of the self-refresh exit command SRX. This feature is fundamentally different from the case of the normal DRAM that returns from the self-refresh mode and then enters the self-refresh mode.

Figure 11:
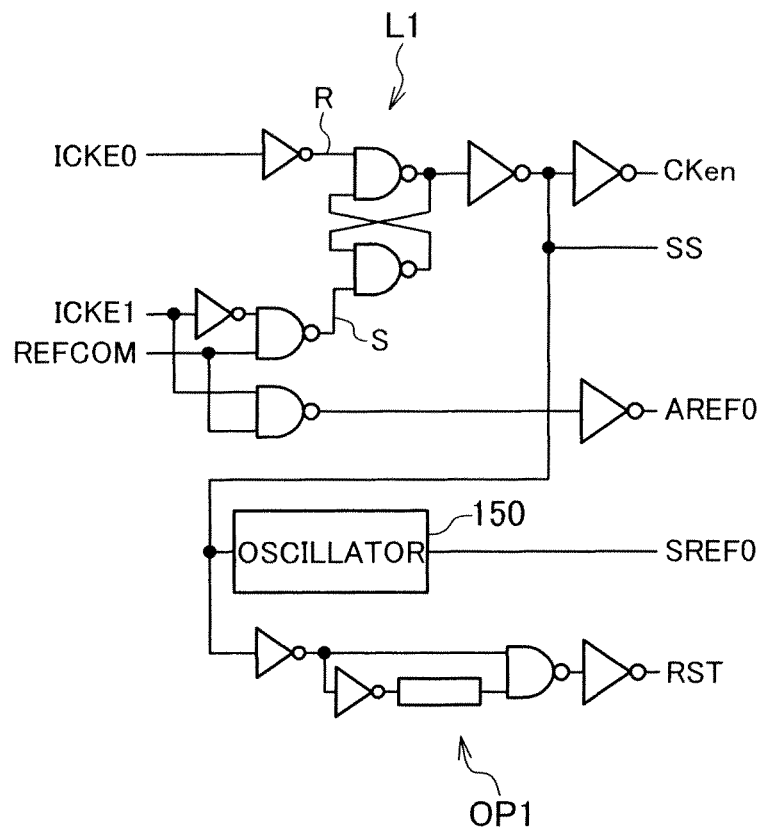
FIG. 11 is a main circuit diagram indicative of an embodiment of a self-refresh control circuit 100 shown in FIG. 10.

During the periods in which the semiconductor device is not in the self-refresh mode, the SR latch circuit L1 shown in FIG. 5 is reset and thus the self-state signal SS is fixed to a low level. Accordingly, the input buffer circuit 72 shown in FIG. 3 is in an active state and the impedance control signal ODT can be input from the controller 50. The impedance control signal IODT0 is latched by the ODT latch circuit 82 in synchronism with the internal clock signal ICLK0, and the impedance control signal IODT0 as a latched signal is supplied to the output buffer circuit 30a. Therefore, the impedance control signal ODT needs to be input in synchronism with a rising edge of the external clock signal CK. Accordingly, input of the impedance control signal ODT is effective during a period in which a setup margin and a hold margin from a rising edge of the external clock signal CK are ensured, and is ineffective in other periods. In FIG. 7, the periods in which input of the impedance control signal ODT is ineffective (Don't care) are shown by hatching. In the example shown in FIG. 7, the impedance control signal ODT is not input (that is, Don't care) in most of the period when the semiconductor device 10 is in the self-refresh mode. The impedance control signal ODT cannot be supplied from the controller 50 in most of the period when the semiconductor device 10 is in the self-refresh mode because the input buffer circuit 72 is inactivated in this period. Specifically, logic of generating the self-state signal SS shown in FIG. 5 is simplified to facilitate understanding, and the input buffer circuit 72 shown in FIG. 3 is activated to introduce the impedance control signal ODT supplied from outside into the semiconductor device each time the self-refresh command SRE is issued at the time t12 and the self-refresh exit command SRX is issued at the time t13. The same holds true for the ODT latch circuit 82 that generates the impedance control signal IODT1, the internal clock signal ICLK0 for controlling the ODT latch circuit 82, and the enable signal CKen for generating the internal clock signal ICLK0. That is, the self-refresh control circuit 100 shown in FIG. 5 contributes to clear understanding of a difference from a self-refresh control circuit 100 compliant with the DRAM standards, which is shown in FIG. 11 and explained later, for example.

When the auto-refresh command REF is issued at the time t11, the auto-refresh signal AREF0 is activated. In response thereto, the refresh counter 90 generates the refresh signals REF2<7:0> for the corresponding banks eight times and the row control circuit 95 supplies the active signals ACT<7:0> to the corresponding banks eight times. The refresh address is incremented in the row control circuit 95, which causes eight different word lines to be selected one after another in synchronism with the eight active signals ACT<7:0>. As a result, a total of 64 word lines are selected. To select these 64 word lines, a refresh period tRFC is required. Therefore, issuance of other commands by the controller 50 is inhibited after the auto-refresh command REF is issued and before the refresh period tRFC passes.

When the self-refresh command SRE is issued at the time t12, the SR latch circuit L1 shown in FIG. 5 is set and the self-state signal SS is changed to a high level. This inactivates the input buffer circuit 72 shown in FIG. 3, thereby reducing power consumption. Furthermore, the enable signal CKen is changed to a low level because the SR latch circuit L2 is reset. This inactivates also the input buffer circuit 71 shown in FIG. 3, thereby reducing power consumption. At the time t12, the clock issuing unit 52 of the controller 50 can stop supply of the external clock signal CK, which has been continuously supplied, in association with issuance of the self-refresh command SRE. Accordingly, power consumption of the system can be lowered.

The self-refresh command SRE is issued, the self-refresh signal SREF0 is immediately activated. When the self-refresh signal SREF0 is activated, the refresh counter 90 performs the same operation as that performed when the auto-refresh signal AREF0 is activated. That is, a total of 64 word lines are selected one after another. In this embodiment, the refresh operation executed in the self-refresh mode is one-time event When the self-refresh exit command SRX is issued at the time t13, the SR latch circuit L1 shown in FIG. 5 is reset, the self-state signal SS is changed to the low level, and the enable signal CKen is changed to the high level. This activates the input buffer circuits 71 and 72 and enables input of the external clock signal CK and the impedance control signal ODT.

The one-shot pulse generating circuit OP1 outputs the update start signal ST in response to change of the self-state signal SS to a low level. Thus, the DLL circuit 200 generates a phase-controlled internal clock signal ICLK1 based on the internal clock signal ICL1 output from the input buffer circuit 71. That is, the update operation of the DLL circuit 200 is performed. When the update operation of the DLL circuit 200 ends, the DLL circuit 200 outputs the update end signal END and then the SR latch circuit L2 is reset. This causes the enable signal CKen to be changed to the low level again, thereby inactivating the input buffer circuit 71. Therefore, power consumption of the input buffer circuit 71 can be reduced during periods other than an update time of the DLL circuit 200 performing self refresh. At that time, the counter circuit 220 is not reset and transits to an inactive state with a count value at the time of generation of the update end signal END kept. It is desirable that a timing when the controller 50 resumes issuance of the external clock signal CK be before a time t13. This is because the update operation of the DLL circuit 200 is immediately performed in response to the self-refresh exit command SRX in the present embodiment. Resumed supply of the external clock signal CK is maintained according to a predetermined time when the update operation of the DLL circuit 200 is finished. That is, the controller 50 stops again the supply of the external clock signal CK after the predetermined time has passed.

In the example shown in FIG. 7, the self-refresh command SRE is issued again during a period when the update operation of the DLL circuit 200 is performed, that is, a period after the update start signal ST is activated and before the update end signal END is activated (a time t14). This causes the SR latch circuit L1 to be set again. However, because the SR latch circuit L2 is already set at that time, the enable signal CKen keeps a high level. When the update end signal END is output and accordingly the SR latch circuit L2 is reset, the enable signal CKen is changed to a low level, thereby inactivating the input buffer circuit 71.

This operation, that is, an operation of alternately issuing the self-refresh command SRE and the self-refresh exit command SRX is repeatedly performed during a period when the controller 50 causes the semiconductor device to enter the pseudo self-refresh mode mentioned above. When an issuance period of the self-refresh command SRE is matched with a performing period of the refresh operation in the self-refresh mode of the normal DRAM (about 7.8 s), all memory cells MC can be refreshed within a unit period (64 ms in the standards). This means it suffices that the number of the self-refresh commands SRE issued in each unit period is matched with the number of the auto-refresh commands REF issued in each unit period.

As described above, because the refresh operation is performed only once, which is the same number as that performed during the auto-refresh, in response to the self-refresh command SRE in the present embodiment, a state where no refresh operation is performed is ensured at a time when the self-refresh exit command SRX is issued after the refresh period tRFC has passed from issuance of the self-refresh command SRE. Accordingly, issuance of the first command is enabled a short time after issuance of the self-refresh exit command SRX. Furthermore, because the update operation of the DLL circuit 200 is performed in response to the self-refresh exit command SRX, a state where the DLL circuit is locked (a state where phases of the internal clock signal ICLK0 and the internal clock signal RCLK are almost matched with each other) is maintained also during the pseudo self-refresh mode. Therefore, the second command using the internal clock signal ICLK1 can be issued a short time after issuance of the self-refresh exit command SRX.

One of the technical concepts of the present application does not exclude other commands during a period when the semiconductor device has entered the pseudo self-refresh mode. Specifically, the controller can set a period of time (tCKE) between t13 and t14 longer while keeping an interval time between the self-refresh commands SRE at the time t12 and at the time t14 to the performing period (about 7.8 μs) mentioned above and also keeping a period of time between t12 and t13 to a time (tRFC; hundreds of nanoseconds (ns)) of internal refresh related to 64 word lines. A period after issuance of the self-refresh exit command SRX and before issuance of the self refresh command SRE is set longer. The controller can issue other commands during this period.

Furthermore, as shown in a second embodiment of the present invention explained below, the controller 50 can issue an impedance control command (impedance control signal ODT) for performing an impedance control of the data terminal 31 during the period of time between t12 and t13.

Figure 8:
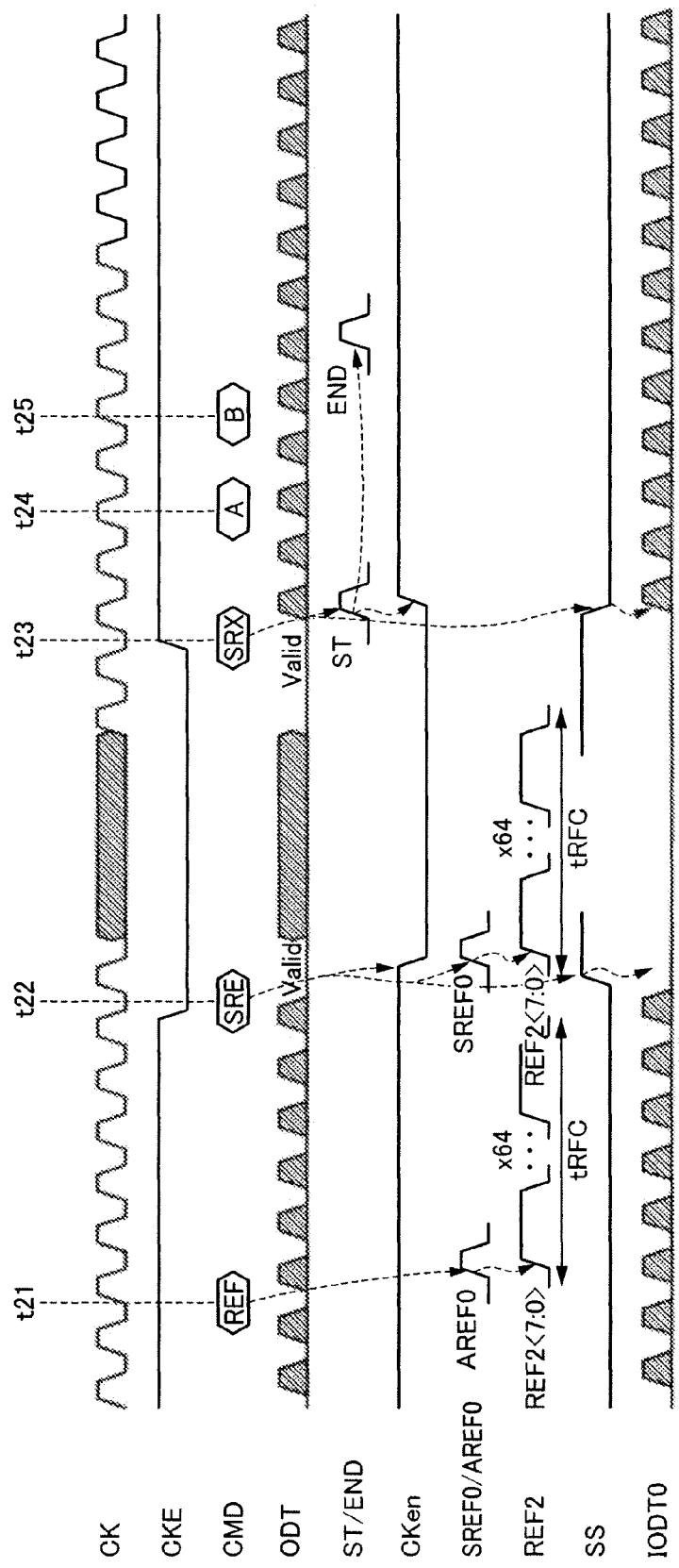
FIG. 8 is a timing chart for explaining advantages according to the first embodiment.

As a modification of FIG. 8, the update operation of the DLL circuit 200 can be performed in response to the self-refresh command SRE, instead of performing the update operation of the DLL circuit 200 in response to the self-refresh exit command SRX. Also in this case, the second command using the internal clock signal ICLK1 can be issued a short time after issuance of the self-refresh exit command SRX. In this case, instead of stopping supply of the external clock signal CK in association with the self-refresh command SRE, the supply is also maintained at the time t12 according to a predetermined time when the update operation of the DLL circuit 200 is finished. After the predetermined time, the supply of the external clock signal CK is stopped again. When a period in which the semiconductor device has entered the self-refresh mode conforms to the refresh period tRFC required for the auto-refresh, the update information of the DLL circuit 200 updated in response to the self-refresh command SRE is useful also at the time of the self-refresh exit command SRX issued after the refresh period tRFC.

Therefore, it can be understood that it suffices to at least either (1) perform the update operation of the DLL circuit 200 in response to the self-refresh exit command SRX or (2) perform the update operation of the DLL circuit 200 in response to the self-refresh command SRE in the present embodiment.

Turning to FIG. 8, the auto-refresh command REF is issued at a time t21, the self-refresh command SRE is issued at a time t22, the self-refresh exit command SRX is issued at a time t23, a first command A is issued at a time t24, and a second command B is issued. The operation when the self-refresh command SRE and the self-refresh exit command SRX are issued is described above, therefore redundant explanation is omitted.

As shown in FIG. 8, a minimum period after the controller a issues the self-refresh exit command SRX and before the first command A can be issued is greatly reduced as compared to the common DRAM and is 7.5 ns, for example. That is, issuance of the first command A is allowed when 7.5 ns have passed from issuance of the self-refresh exit command SRX. This is because a state where no refresh operation is performed is ensured at a time when the self-refresh command SRX is issued, as described above.

Also a minimum period after the self-refresh exit command SRX is issued and before the second command B can be issued is greatly reduced as compared to the common DRAM and is 24 ns, for example. That is, issuance of the second command B is allowed when 24 ns have passed from issuance of the self-refresh exit command SRX.

Although the second command B is issued at a time t25 when the update end signal END is output from the DLL circuit 200 and the update operation of the DLL circuit 200 is not finished yet, there is no problem in a practical operation. This is because the update operation indicated at the time t13 in FIG. 7 is repeatedly performed and phases of the internal clock signal ICLK1 and the external clock signals CK and CKB are almost matched with each other. There is no problem in the modification shown in FIG. 8 in which the update operation of the DLL circuit 200 is performed in response to the self-refresh command SRE.

Figure 9:
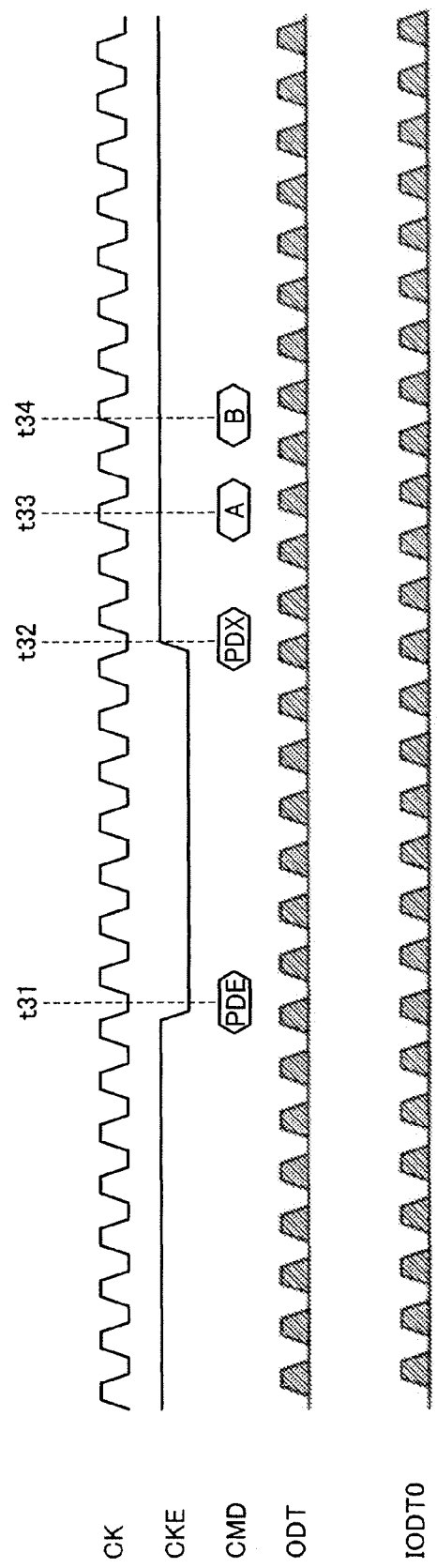
FIG. 9 is another timing chart for explaining an operation of the access control circuit 20 shown in FIG. 3.

Turning to FIG. 9, the power-down command PDE is issued at a time t31, the power-down exit command PDX is issued at a time t32, the first command A is issued at a time t33, and the second command B is issued at a time t34. Therefore, the semiconductor device 10 is in the power-down mode during a period of time from t31 to t32.

In this case, the power-down mode is an operation mode in which input of the first and second commands is inhibited as in the self-refresh mode compliant with the DRAM standards. Major differences of the power-down mode from the self-refresh mode are such that the controller needs to continuously supply the external clock signals CK and CKB to the semiconductor device 10 and can input the impedance control signal ODT in the power-down mode, and that the semiconductor device does not perform an automatic refresh operation (refresh of storage data), causes the DLL circuit to operate, and activates an input circuit (input buffer circuit) connected to an external terminal of the semiconductor device 10 while reducing power consumption of internal circuits of the semiconductor device 10 in the power-down mode and the like. For example, the input buffer circuit 71 connected to the clock terminals 23 and 24 is activated in the power-down mode and is inactivated in the self refresh mode complying with the DRAM standards. Due to these differences, while a period before a command (the first command) can be input after power-down exit is advantageously shorter in the power-down mode than in the self-refresh mode, power consumption in the self-refresh mode is lower than in the power-down mode. This is particularly because the input buffer circuit 71 and the DLL circuit 200 are activated in the power-down mode.

A minimum period after the power-down exit command PDX is issued and before the first command A can be issued is equal to a minimum period after the self-refresh exit command SRX is issued and before the first command A can be issued. That is, issuance of the first command A is allowed when 7.5 ns, for example, have passed from issuance of the power-down exit command PDX. This is because no refresh operation is performed in the power-down mode and thus a state where no refresh operation is performed is ensured at a time when the power-down command PDX is issued, as mentioned above.

A minimum period after the power-down exit command PDX is issued and before the second command B can be issued is equal to a minimum period after the self-refresh exit command SRX is issued and before the second command B can be issued. That is, issuance of the second command B is allowed when 24 ns, for example, have passed from issuance of the power-down exit command PDX. This is because the external clock signal CK is input in the power-down mode to enable the update operation of the DLL circuit 200 and thus the DLL circuit 200 can be maintained in a locked state.

As described above, in the present embodiment, the minimum input times of the first or second command after exit in the self-refresh mode and the power-down mode are the same. This means that the conventional problem that a recovery time from the self-refresh mode is long is solved. Therefore, engineers who write an algorithm of this chip set will more often select in the algorithm the pseudo refresh mode of the present application than the power-down mode.

Because not specified in the DRAM standards, the operation of the first embodiment mentioned above cannot ensure as it is compatibility with a DRAM complying with the standards. When this causes a problem, it is desirable to use a configuration that enables to switch between the operation of the first embodiment and the operation specified in the standards. That is, it suffices to design a circuit to perform the operation meeting the DRAM standards in the first operation mode and perform the operation of the first embodiment in the second operation mode.

Figure 10:
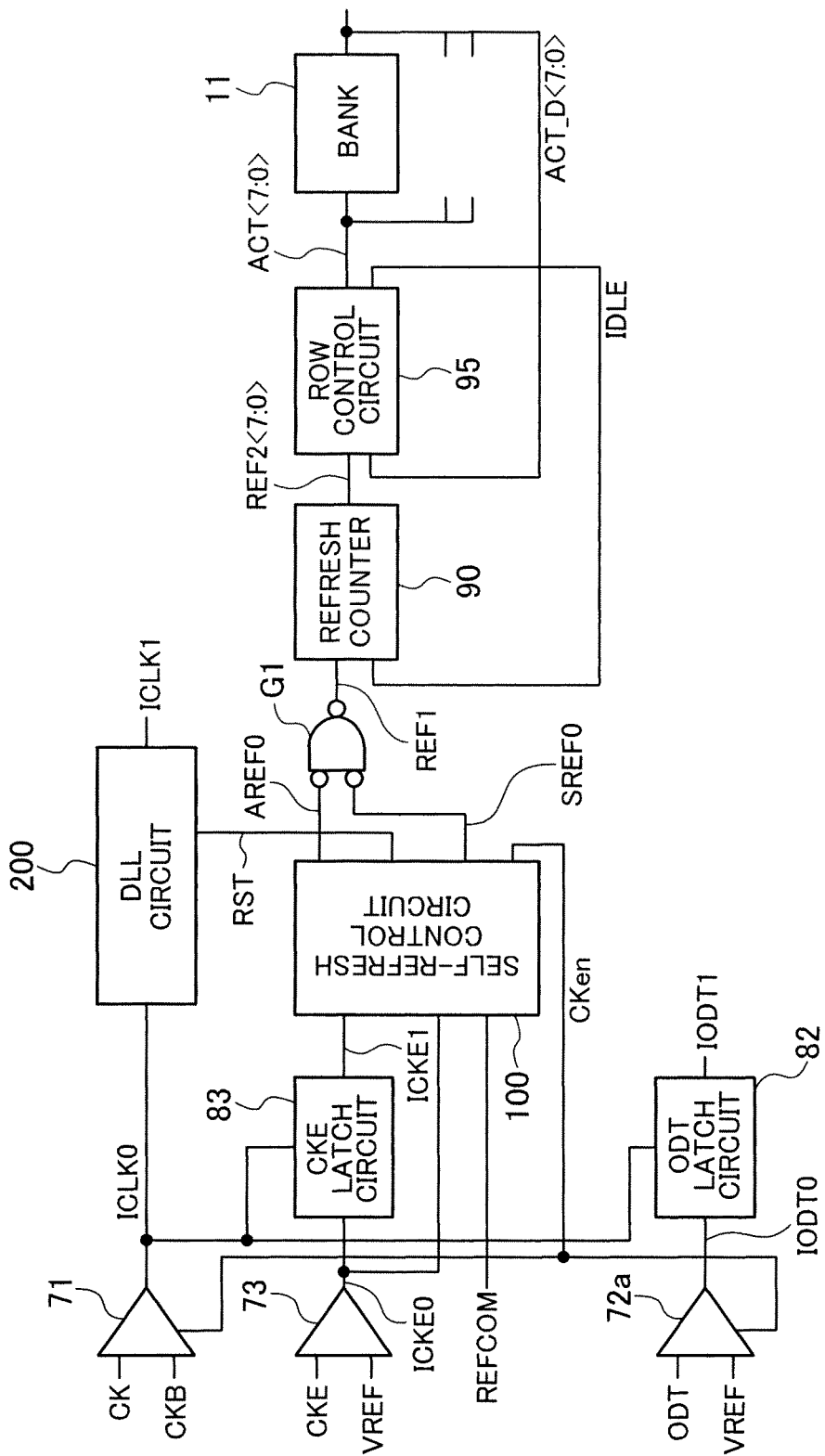
FIG. 10 is another block diagram indicative of an embodiment of main circuit blocks included in an access control circuit 20 and shows a case where an information processing system operates in a first operation mode complying with the DRAM standards.

Turning to FIG. 10, while a circuit shown in FIG. 10 is different from that shown in FIG. 3, it is unnecessary to separately provide the circuit shown in FIG. 3 and that shown in FIG. 10 but it suffices to switch functions according to a selected operation mode. Therefore, it suffices to realize function switching by using a gate circuit or the like (not shown) to function as the circuit shown in FIG. 10 when the first operation mode is selected and to function as the circuit shown in FIG. 3 when the second operation mode is selected. The same holds true for the circuit shown in FIG. 11.

In the access control circuit 20 shown in FIG. 10, the enable signal CKen is supplied to an input buffer circuit 72a in addition to the input buffer circuit 71. This eliminates the use of the self-state signal SS. With this configuration, when the semiconductor device enters the self-refresh mode, the input buffer circuits 71 and 72a are both fixed to an inactive state. Accordingly, power consumption is reduced more than in the second operation mode.

Turning to FIG. 11, the self-refresh control circuit 100 includes an oscillator 150 which is activated when the SR latch circuit L1 is set. Thus, a refresh operation is periodically performed in asynchronism with the external clock signal CK when the semiconductor device has entered the self-refresh mode. The SR latch circuit L2 is unnecessary. The output of the one-shot pulse generating circuit OP1 is used as the reset signal RST. Accordingly, in the first operation mode, when the self-refresh exit command SRX is issued, the DLL circuit 200 is reset.

Figure 12:
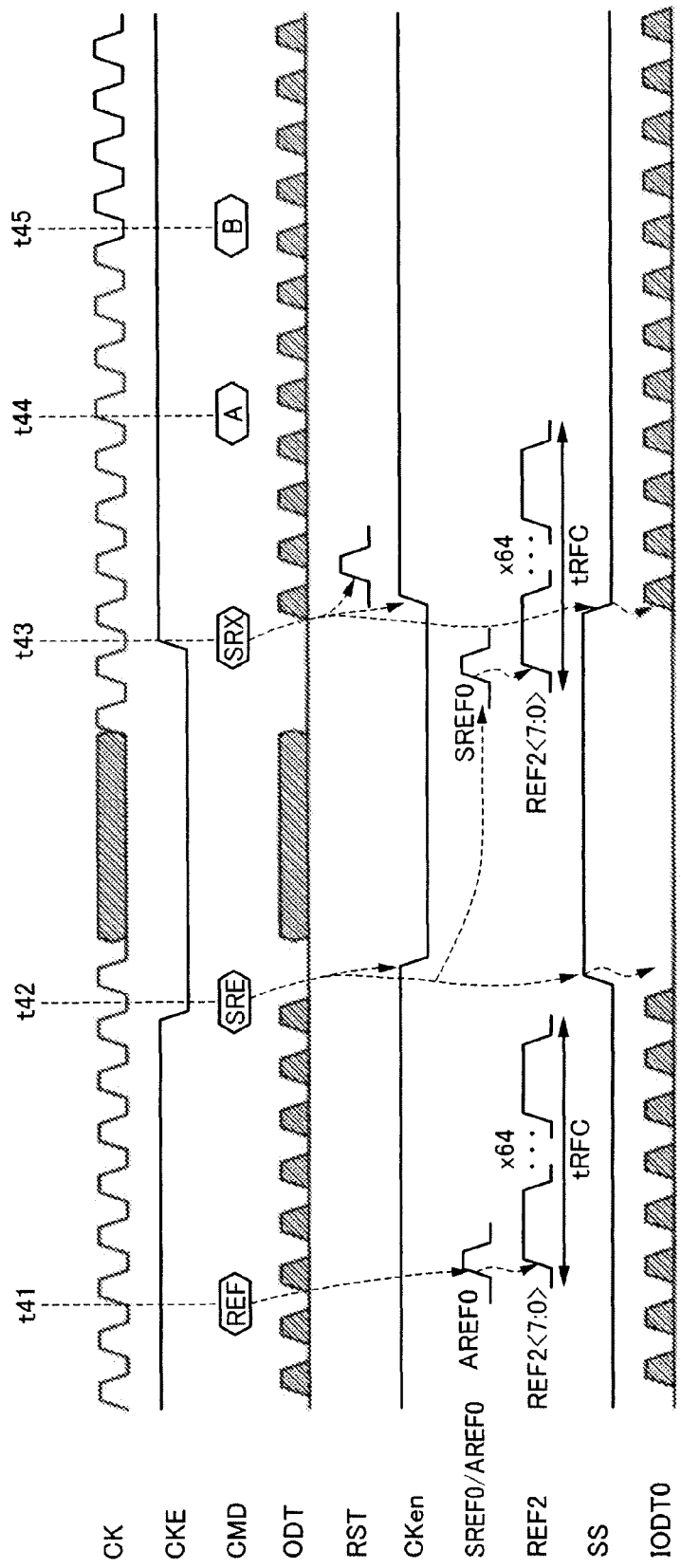
FIG. 12 is a timing chart for explaining an operation of the access control circuit 20 in the first operation mode.

Turning to FIG. 12, the auto-refresh command REF is issued at a time t41, the self-refresh command SRE is issued at a time t42, and the self-refresh exit command SRX is issued at a time t43. Therefore, the semiconductor device 10 is in the self-refresh mode during a period of time from t42 to t43 and the semiconductor device 10 is not in the self-refresh mode during other periods. A period after the self-refresh command SRE is issued and after the self-refresh exit command SRX is issued in the first operation mode is longer than a period after the self-refresh command SRE is issued and after the self-refresh exit command SRX is issued in the second operation mode.

During the periods in which the semiconductor device is not in the self-refresh mode, the SR latch circuit L1 shown in FIG. 11 is reset and thus the enable signal CKen is fixed to a high level. Accordingly, the input buffer circuits 71 and 72a shown in FIG. 10 are active. When the auto-refresh command REF is issued at the time t41 in this state, the auto refresh signal AREF0 is activated. An operation performed in this case is as explained with reference to FIG. 7.

When the self-refresh command SRE is issued at the time t42, the SR latch circuit L1 shown in FIG. 11 is set and the enable signal CKen is changed to a low level. This inactivates the input buffer circuits 71 and 72a shown in FIG. 10 and reduces power consumption. Furthermore, the refresh signal SREF0 is periodically output from the oscillator 150 and the same operation as in the case where the auto refresh signal AREF0 is activated is performed. While the refresh signal SREF0 is activated once in FIG. 11, the refresh signal SREF0 is periodically generated by the oscillator 150 during the period when the semiconductor device 10 has entered the self-refresh mode.

In the first operation mode, the input buffer circuit 71 is always kept in an inactive state during the period when the semiconductor device has entered the self-refresh mode. Accordingly, the controller does not supply the external clock signals CK and CKB. This enables reduction in power consumption of the system. In the first operation mode, the external clock signals CK and CKB are not supplied to the semiconductor device and thus the DLL circuit 200 is also kept in an inactive state. Accordingly, power consumption during the period when the semiconductor device has entered the self-refresh mode in the first operation mode is reduced more than in the second operation mode mentioned above. Because the input buffer circuit 72a is inactivated during the period when the semiconductor device has entered the self-refresh mode, the impedance control signal ODT cannot be input during this period. This means that, in a system that commonly uses data terminals of a plurality of semiconductor devices (that is, a configuration in which the data terminals of the semiconductor devices are commonly connected to a data bus of the system), when a controller causes one of the semiconductor devices to enter the self-refresh mode, for example, an impedance of the data terminal thereof cannot be adjusted and thus the write command WT cannot be issued to the other semiconductor device. This is because prevention of data reflection is essential in a system to which high frequency data are transferred. On the other hand, in a power-down mode, impedance adjustment of the data terminal can be performed during that period. Therefore, in this case, the controller selects the power-down mode in the first operation mode, instead of the self-refresh mode in which power consumption is low. From this viewpoint, accordingly, it is desirable that the self refresh mode with low power consumption be selected while impedance adjustment of the data terminal can be performed during the self-refresh mode. This will be explained in detail in a second embodiment of the present invention.

When the self-refresh exit command SRX is issued at the time t43, the SR latch circuit L1 shown in FIG. 11 is reset and the enable signal CKen is changed to the high level. This activates the input buffer circuits 71 and 72a and enables input of the external clock signal CK and the impedance control signal ODT. Furthermore, the reset signal RST is output from the one-shot pulse generating circuit OP1, thereby resetting the DLL circuit 200. As described above, the reset signal RST is for entirely initializing the DLL circuit 200 and, when the reset signal RST is activated, the count value of the counter circuit 220 is reset to an initial value. Accordingly, a certain time is required to enable output of the internal clock signal ICLK1 phase-controlled. In this example, issuance of the second command is inhibited until 512 clock cycles have passed from issuance of the self-refresh exit command SRX. The 512 clock cycles are longer than a maximum period required to lock the DLL circuit 200 after the DLL circuit 200 is reset. That is, when the 512 clock cycles (standard) have passed, it means that the DLL circuit 200 is definitely locked. In the example shown in FIG. 12, the second command B is issued at a time t45. Thus, in the first operation mode, a minimum period after the self-refresh exit command SRX is issued and before the second command B can be issued is longer than the second operation mode.

On the other hand, the command for performing an access to the memory cell array 11 based on a row address, that is, the first command cannot be issued at least until passage of the refresh period tRFC from issuance of the self-refresh exit command SRX. This is because the refresh operation is performed in asynchronism with the external clock signal CK during the self-refresh mode and thus the refresh operation may be performed when the self-refresh exit command SRX is issued. The first command is denoted by A in FIG. 12 and is input at a time t44. In the first operation mode, a minimum period after the self-refresh exit command SRX is issued and before the first command A can be issued is tRFC+10 ns, for example. That is, issuance of the first command A is allowed when tRFC+10 ns have passed from issuance of the self-refresh exit command SRX. Thus, A minimum period after the self-refresh exit command SRX is issued and before the first command A can be issued in the first operation mode is longer than that in the second operation mode.

As described above, when the first operation mode is selected, the operation complying with the standards is performed although a recovery time from the self-refresh mode is longer than the second operation mode. Therefore, compatibility with the existing DRAM can be ensured. In addition, power consumption during the period when the semiconductor device has entered the self-refresh mode can be reduced more than when the second operation mode is selected. Furthermore, frequencies of the external clock signals CK and CKB can be changed when the semiconductor device exits the self-refresh mode after the semiconductor device enters the self-refresh mode. In the second operation mode, the locked state of the DLL circuit 200 needs to be maintained even in the self-refresh mode and thus the frequencies of the external clock signals CK and CKB cannot be changed even when the semiconductor device enters the self-refresh mode.

The second embodiment of the present invention is explained next.

Figure 13:
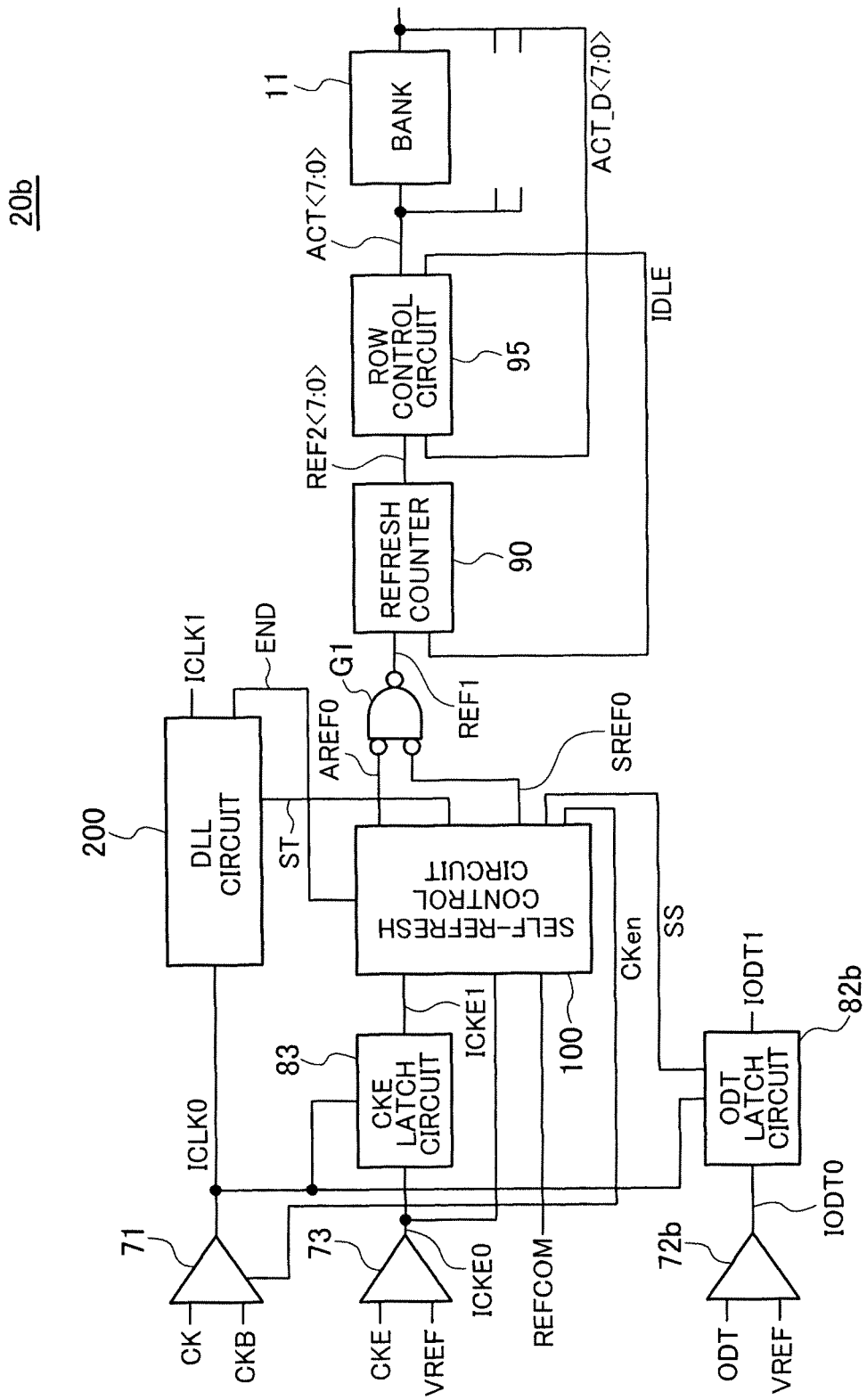
FIG. 13 is a block diagram indicative of an embodiment of main circuit blocks included in an access control circuit 20b according to a second embodiment.

The access control circuit 20b shown in FIG. 13 is different from the access control circuit 20 shown in FIG. 3 in that the input buffer circuit 72 is replaced by an input buffer circuit 72b and that the ODT latch circuit 82 is replaced by an ODT latch circuit 82b. Other features of the access control circuit 20b are basically the same as those of the access control circuit 20 shown in FIG. 3, and therefore like elements are denoted by like reference characters and redundant explanations thereof will be omitted. In the third embodiment, the input buffer circuit 72b is always activated and therefore the controller can input the impedance control signal ODT even during a period when the semiconductor device has entered the self-refresh mode. Accordingly, even when one of semiconductor devices has been entered the self-refresh mode, the controller can perform an impedance control of a data terminal of the semiconductor device and can issue the write command WT to the other semiconductor device. This enables the controller 50 to control the other semiconductor device while reducing power consumption.

Figure 14:
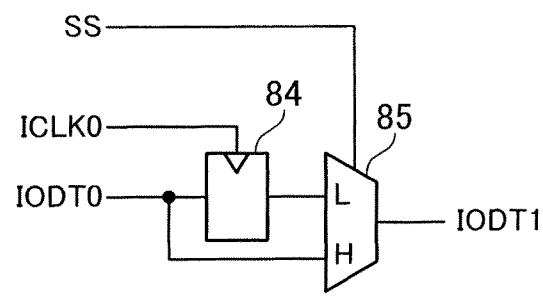
FIG. 14 is a circuit diagram indicative of an embodiment of an ODT latch circuit 82b.

Turning to FIG. 14, the ODT latch circuit 82b includes a latch circuit 84 and a selector 85. The latch circuit 84 latches the impedance control signal IODT0 in synchronism with the internal clock signal ICLK0. The selector 85 is a circuit that selects one of an output from the latch circuit 84 and the impedance control signal IODT0, and selection is performed based on the self-state signal SS. Specifically, the output from the latch circuit 84 is selected when the self-state signal SS has a low level and the impedance control signal IODT0 is selected when the self-state signal SS has a high level. This means that the output from the latch circuit 84 is used as the impedance control signal IODT1 during a period when the semiconductor device is not in the self-refresh mode and that the impedance control signal IODT0 is used as it is as the impedance control signal IODT1 during a period when the semiconductor device has entered the self-refresh mode.

Figure 15:
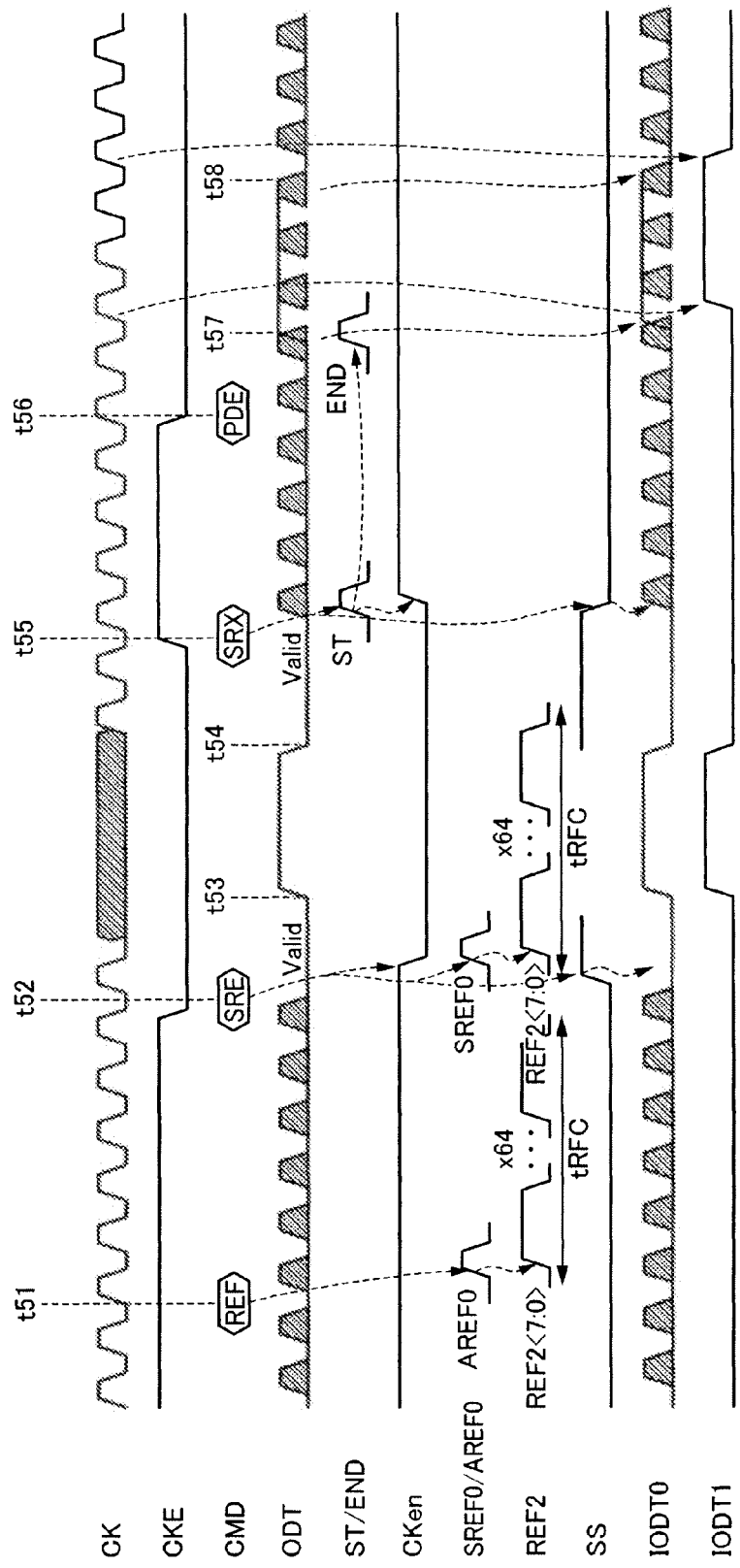
FIG. 15 is a timing chart for explaining an operation of the access control circuit 20a shown in FIG. 13.

Turning to FIG. 15, the auto-refresh command REF is issued at a time t51, the self-refresh command SRE is issued at a time t52, the self-refresh exit command SRX is issued at a time t55, and the power-down command PDE is issued at a time t56. Therefore, the semiconductor device 10 is in the self-refresh mode during a period of time from t52 to t55 and the semiconductor device 10 is in a power-down mode during a period after the time t56. In this case, the power-down mode is an operation mode in which input of the first and second commands is inhibited as in the self-refresh mode. Major differences of the power-down mode from the self-refresh mode are such that the controller needs to continuously supply the external clock signals CK and CKB to the semiconductor device and can input the impedance control signal ODT in the power-down mode, and that the semiconductor device does not perform an automatic refresh operation, causes the DLL circuit to intermittently operate even in the power-down mode, and activates a plurality of input circuits connected to a plurality of external terminals of the semiconductor device 10, respectively, while reducing power consumption of internal circuits of the semiconductor device 10 in the power-down mode and the like. Due to these differences, while a period before a command (the first command) can be input after power-down exit is advantageously shorter in the power-down mode than in the self-refresh mode, power consumption in the self-refresh mode is lower than in the power-down mode. This is because the input buffer circuits 71 to 73 and the DLL circuit 200 are activated in the power-down mode.

An operation performed before the semiconductor device enters the self-refresh mode is the same as that in the first embodiment. Therefore, when the auto-refresh command REF is issued at the time t51, the row control circuit 95 supplies the active signals ACT<7:0> eight times to the corresponding banks. This enables eight word lines to be selected one after another and memory cells MC connected to a total of 64 word lines to be refreshed.

Subsequently, when the self-refresh command SRE is issued at a time t52, the semiconductor devices enters the self-refresh mode. An operation performed by the semiconductor device 10 in response to the self-refresh command SRE is as mentioned above. The refresh operation is performed once.

Because the self-state signal SS is changed to a high level when the semiconductor device enters the self-refresh mode, the impedance control signal ODT supplied from the controller is introduced as it is as the impedance control signal IODT1. That is, the impedance control signal IODT1 is introduced independently of (in asynchronism with) the external clock signals CK and CKB. In an example shown in FIG. 15, the impedance control signal ODT is activated to a high level during a period of time from t53 to t54 and is internally used as it is as the impedance control signal IODT1. As a result, although the input buffer circuit 71 that receives the external clock signals CK and CKB is basically inactivated during the period when the semiconductor device has entered the self-refresh mode, the output buffer circuit 30a shown in FIG. 2 can perform an impedance control of the data terminal 31 independently of the external clock signals CK and CKB.

When the self-refresh exit command SRX is issued at the time t55, the input buffer circuit 71 is activated, input of the external clock signals CK and CKB is enabled, and the impedance control signal ODT is input in synchronism with the internal clock signal ICLK0. In addition, the update operation of the DLL circuit 200 is performed as is the case with the first embodiment.

In this example, the power-down command PDE is issued at the time t56 and the impedance control signal ODT is activated to the high level during a period of time from t57 and t58 in which the semiconductor device has entered the power-down mode. Because the impedance control signal ODT is introduced in synchronism with the internal clock signal ICLK0 during this period, the output buffer circuit 30a shown in FIG. 2 can perform an impedance control of the data terminal 31 in synchronism with the external clock signals CK and CKB.

As described above, according to the second embodiment, the effect of the first embodiment mentioned above is obtained and also the controller can issue the impedance control signal ODT even during the period of the self-refresh mode. Even during the period of having entered the self-refresh mode, the semiconductor device can receive the impedance control signal ODT and perform the impedance control. Also the operation of the second embodiment is not specified in the DRAM standards and thus a configuration that enables switching between the operation of the second embodiment and the operation specified in the standards is desirable. That is, it suffices to design a circuit to perform the operation compliant with the DRAM standards in the first operation mode and perform the operation of the second embodiment in the second operation mode. The first operation mode is as already explained. The operations of the first and second embodiments can be combined.

An information processing system according to an embodiment of the present invention is explained next.

Figure 16:
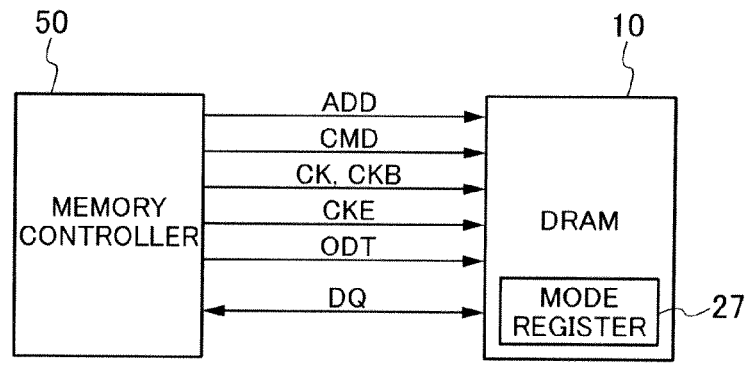
FIG. 16 is a block diagram indicative of a first preferred embodiment of an information processing system according to the present invention.

Turning to FIG. 16, the information processing system has a configuration in which one controller 50 and one semiconductor device (DRAM) 10 are used and are connected with each other. The controller 50 supplies the address signal ADD, the command signal CMD, the external clock signals CK and CKB, the clock enable signal CKE, and the impedance control signal ODT to the semiconductor device 10. The controller 50 sets the semiconductor device 10 to the first or second operation mode. When having set the semiconductor device 10 to the first operation mode, the controller 50 issues the command signal CMD and the like according to the DRAM standards. On the other hand, when having set the semiconductor device to the second operation mode, the controller 50 issues the command signal CMD and the like at a timing not compliant with the DRAM standards, thereby realizing the operations explained in the first and second embodiments.

Selection of an operation mode can be performed by setting the operation mode in a mode register 27 included in the semiconductor device 10. Setting to the mode register 27 is performed by a method of issuing a mode-register set command (MRS) and inputting an operation mode to be set through the address terminal 21. According to this method, the first or second operation mode is selected at the time of initialization of the semiconductor device 10.

However, selection of an operation mode is not limited thereto and the first or second operation mode can be selected by a so-called on-the-fly method. That is, an additional signal that specifies the first or second operation mode can be issued using the address terminal 21 or the data terminal 31 when the self-refresh command SRE is issued, thereby selecting the first or second operation mode each time the semiconductor device enters the self-refresh mode.

Figure 17:
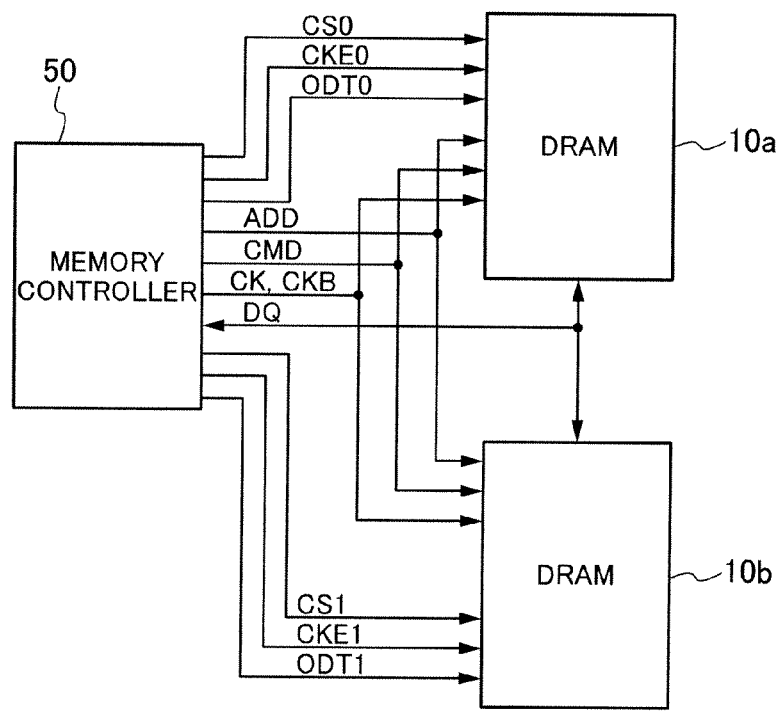
FIG. 17 is a block diagram indicative of a second preferred embodiment of an information processing system according to the present invention.

Turning to FIG. 17, two semiconductor devices (DRAMs) 10a and 10b are connected to one controller 50. The address signal ADD, the command signal CMD, the external clock signals CK and (KB from the controller 50 are commonly supplied to the two semiconductor devices 10a and 10b. The data terminals 31 of the semiconductor devices 10a and 10b are also commonly connected to the controller 50. On the other hand, the clock enable signal CKE and the impedance control signal ODT are separately supplied to the semiconductor devices 10a and 10b. That is, a clock enable signal CKE0 and an impedance control signal ODT0 are supplied to the semiconductor device 10a and a clock enable signal CKE1 and an impedance control signal ODT1 are supplied to the semiconductor device 10b. Selection of the semiconductor device 10a or 10b is performed by a chip select signal CS0 or CS1. That is, the command signal CMD or the like issued from the controller 50 becomes valid only for the semiconductor device 10a or 10b to which the chip select signal is activated.

Figure 18:
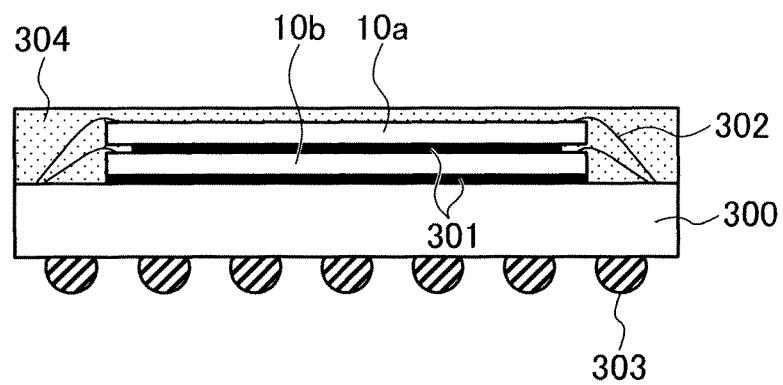
FIG. 18 is a schematic cross-sectional view for explaining a configuration of a dual-die package DDP, which is a package having two semiconductor devices 10a and 10b.

Turning to FIG. 18, the dual-die package DDP having a configuration in which the two semiconductor devices 10a and 10b are stacked on a package substrate 300 is shown. Between the semiconductor devices 10a and 10b and between the semiconductor device 10b and the package substrate 300, an adhesive 301 is interposed, which fixes the semiconductor devices 10a and 10b and the semiconductor device 10b and the package substrate 300 to each other The semiconductor devices 10a and 10b and the pack age substrate 300 are connected with a bonding wire 302, which electrically connects the semiconductor devices 10a and 10b to external terminals 303 through an internal wire (not shown) provided in the package substrate 300. A sealing resin 304 is provided on the package substrate 300 to protect the semiconductor devices 10a and 10b and the bonding wire 302.

Figure 19:
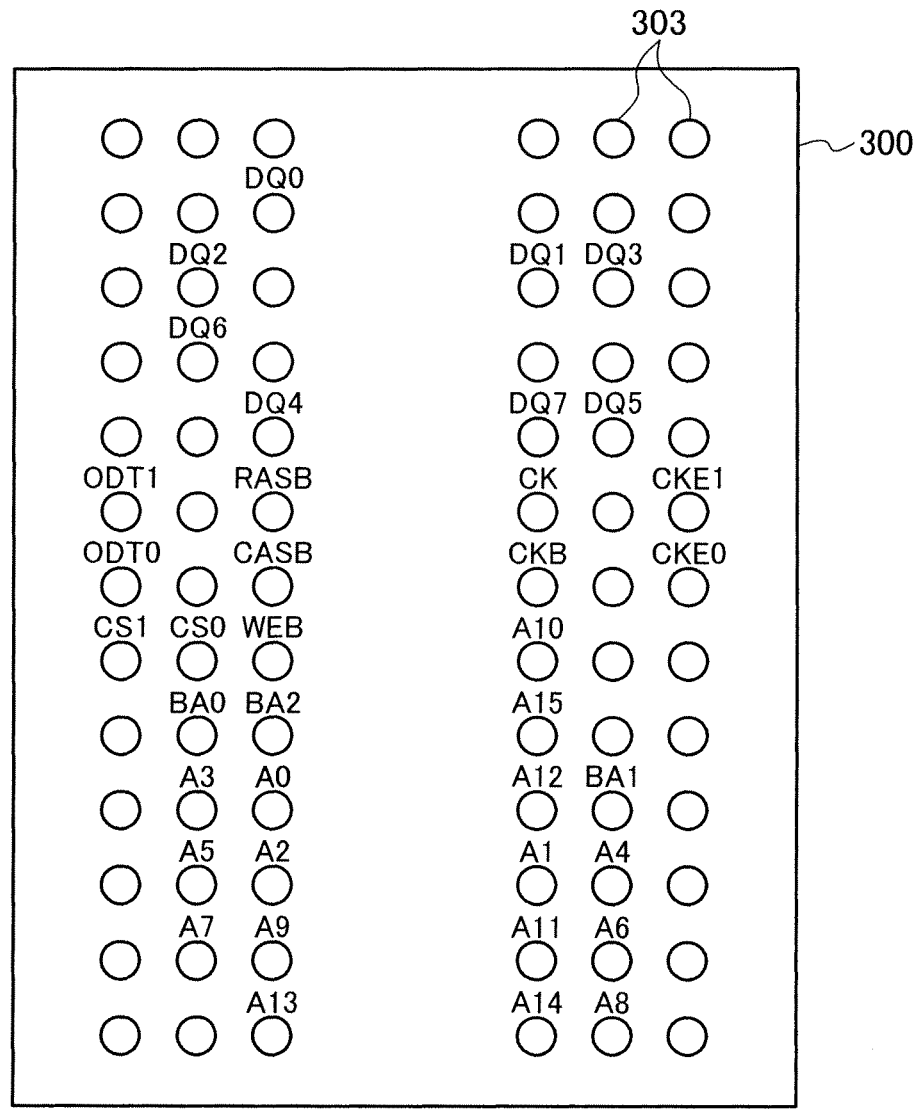
FIG. 19 is a schematic plan view showing an example of a layout of the external terminals 303 provided on the dual-die package DDP.

Turning to FIG. 19, the external terminals 303 are laid out in a matrix on the dual-die packaged DDP. Among these terminals, those related to the address signal ADD, the command signal CMD, the external clock signals CK and CKB, and data DQ are provided commonly for the semiconductor devices 10a and 10b. On the other hand, those related to the clock enable signal CKE, the impedance control signal ODT, and the chip select signal CS are provided separately for the semiconductor devices 10a and 10b. Therefore, even when only one of the semiconductor devices 10a and 10b has entered the self-refresh mode, the external clock signals CK and CKB are continuously supplied to both of the semiconductor devices 10a and 10b.

When it is configured to enable input of the impedance control signal ODT even in the self-refresh mode as in the can be set to a high level, thereby performing an impedance control of the output buffer circuit 30a, even when both of the semiconductor devices 10a and 10b have entered the self-refresh mode.

Figure 20:
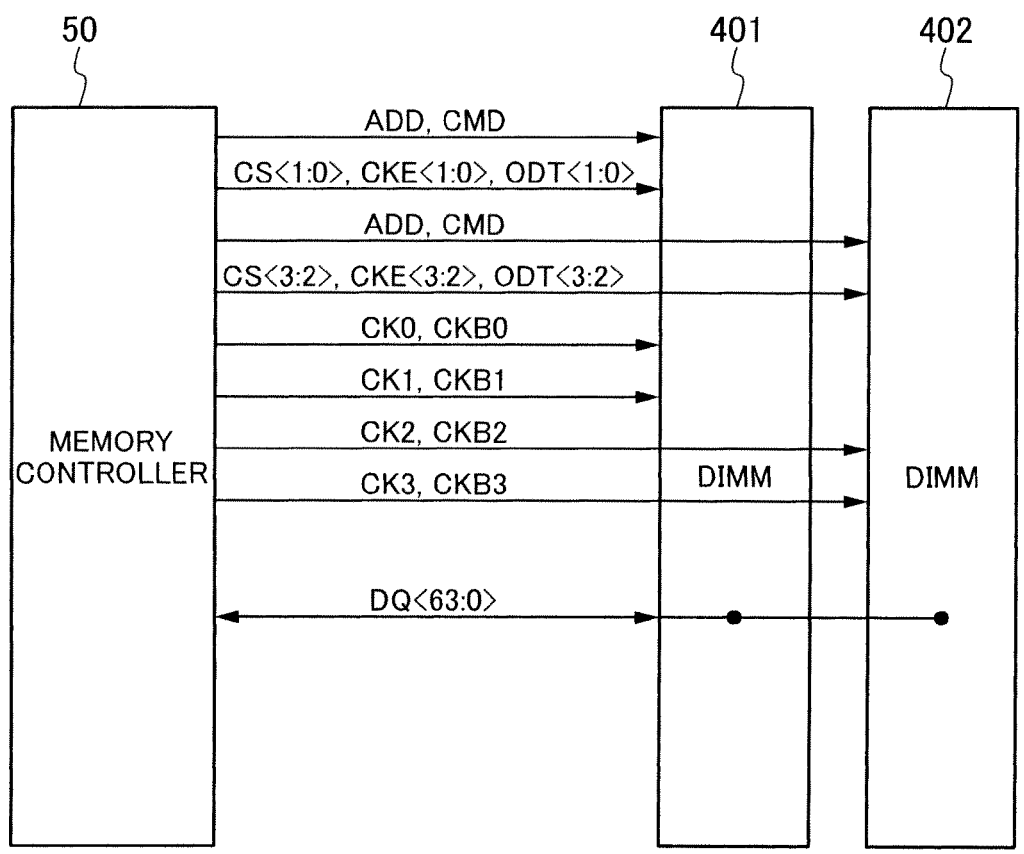
FIG. 20 is a block diagram indicative of a third preferred embodiment of an information processing system according to the present invention.

Turning to FIG. 20, two DIMMs (Dual Inline Memory Modules) 401 and 402 are connected to one controller 50. For example, 16 semiconductor devices (DRAMs) 10 are mounted on each of the DIMMs 401 and 402. Each of the DIMMs 401 and 402 has a two-rank configuration and accordingly there are four ranks in total. One rank is composed of eight semiconductor devices 10, for example, which are arranged on one of surfaces of a module substrate although not particularly limited thereto. A rank is exclusively selected by chip select signals CS0 to CS3.

The address signal ADD and the command signal CMD from the controller 50 are supplied to each of the DIMMs 401 and 402. On the other hand, the external clock signals CK and CKB are supplied to each rank. The data terminals 31 are commonly supplied to the controller 50 in the four ranks.

Turning to FIGS. 21A to 21C, when a write operation is performed for the DIMM 401, one of the ranks (the rank 1 in FIG. 21A) in the DIMM 401 is terminated to 120 ohms (S) and one of the ranks (the rank 2 in FIG. 21A) in the DIMM 402 is terminated to 30Ω as shown in FIG. 21A. When a write operation is performed for the DIMM 402, one of the ranks (the rank 2 in FIG. 21B) in the DIMM 401 is terminated to 30Ω and one of the ranks (the rank 1 in FIG. 21B) in the DIMM 402 is terminated to 120Ω as shown in FIG. 21B.

As shown in FIG. 21C, when a read operation is performed for the DIMM 401, one of the ranks (the rank 2 in FIG. 21C) in the DIMM 402 is terminated to 30Ω. When a read operation is performed for the DIMM 402, one of the ranks (the rank 2 in FIG. 21D) in the DIMM 401 is terminated to 30Ω as shown in FIG. 21D.

In this example, even when one of the DIMMs 401 and 402 is to be accessed, the other one of the DIMMs 401 and 402 needs to be functioned as a terminating resistor. Such a control is particularly required when an operating frequency is high. When this control is required, ranks that do not need to be accessed can be entered into the self-refresh mode in which power consumption is much lower than in the power-down mode by using the semiconductor device according to the second embodiment. That is, in the semiconductor device according to the second embodiment, the impedance control signal ODT can be input even when the semiconductor devices has entered the self-refresh mode and thus a desired terminating resistance can be obtained by outputting the impedance control signal ODT from the controller 50 in synchronism with a read operation or a write operation for another rank.

It is apparent that the present invention is not limited to the above embodiments, but may be modified and changed without departing from the scope and spirit of the invention.

For example, while the number of memory cells to be refreshed in response to the auto-refresh command REF is equal to that of memory cells to be refreshed in response to the self-refresh command SRE in the above embodiments, this is not essential in the present invention.

Furthermore, a PLL circuit can be used instead of the DLL circuit. The controller 50 can have functions other than that of controlling a memory.

The technical concept of the present invention can be applied to a semiconductor device having various functional chips, a controller thereof, and a system thereof. Furthermore, the configuration of each circuit disclosed in the drawings is not limited to the circuit form disclosed in the above embodiments.

The technical concept of the system of the present invention may be applied to various semiconductor devices. For example, the present invention can be applied to a general system including a CPU (Central Processing Unit), an MCU (Micro Control Unit), a DSP (Digital Signal Processor), an ASIC (Application Specific Integrated Circuit), and an ASSP (Application Specific Standard Product), a Memory and the like. An SOC (System on Chip), an MCP (Multi Chip Package), and a POP (Package on Package) and so on, and a module on which they are applied are pointed to as examples of types of system to which the present invention is applied. The present invention can be applied to the system that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following controllers, control methods thereof, control methods of an information processing system, and semiconductor devices:

A1. A controller comprising a command issuing unit that issues at least a self-refresh command that causes a semiconductor device to enter a self-refresh mode in which a refresh operation on a predetermined number of memory cells included in memory cell array of the semiconductor device is performed, a self-refresh exit command that causes the semiconductor device to exit the self-refresh mode, an auto-refresh command that causes the semiconductor j device to perform the refresh operation on the predetermined number of the memory cells, a power-down command that causes the semiconductor device to enter a power-down mode n which the semiconductor device reduces a power consumption thereof without performing the refresh operation, a power-down exit command that causes the semiconductor device to exit the power-down mode, and a first command that causes the semiconductor device to perform an access operation to storage data in the memory cell array, wherein an interval of issuing the self-refresh commands is substantially the same as that of the auto-refresh commands, the command issuing unit issues the first command to the semiconductor device after elapse of a first period at earliest from issuing the power-down exit command, and the command issuing unit issues the first command to the semiconductor device after elapse of a second period that is substantially the same time length as the first period at earliest from issuing the self-refresh exit command.

A2. The controller as A1, wherein the command issuing unit issues a second command, that causes the semiconductor device to output the storage data through a data terminal or to control an impedance of the data terminal, to the semiconductor device after elapse of a third period at earliest from issuing the power-down exit command, and the command issuing unit issues the second command to the semiconductor device after elapse of a fourth period that is substantially the same time length as the third period at earliest from issuing the self-refresh exit command.

A3. The controller as A1 or A2, wherein the command issuing unit issues the first command to the semiconductor device after elapse of a fifth period that is longer than the first and second periods at earliest from issuing the auto-refresh command.

A4. The controller as A2 or A3, wherein the command issuing unit issues the second command to the semiconductor device after elapse of a sixth period that is longer than the third and fourth periods at earliest from issuing the auto-refresh command.

A5. The controller as any one of A1 to A4, further comprising a clock signal issuing unit that issues a clock signal having a predetermined frequency to the semiconductor device, wherein the clock signal issuing unit continuously issues the clock signal to the semiconductor device even if the semiconductor device is in the power down mode, and the clock signal issuing unit stops issuing the clock signal while the semiconductor device is in the self-refresh mode, and reissuing the clock signal to the semiconductor device for a predetermined period in conjunction with the self-refresh exit command.

A6. The controller as A5, wherein the clock signal issuing unit reissues the clock signal to the semiconductor device even before the command issuing unit issues the self-refresh exit command.

A7. The controller as A5 or A6, wherein the clock signal issuing unit continuously issues the clock signal to the semiconductor device until elapse of the predetermined period from an issuance of the self-refresh exit command even if the command issuing unit reissues the self-refresh command.

A8. The controller as any one of A1 to A7, wherein a number of the self-refresh commands issued in each unit period is substantially the same as a number of the auto-refresh commands issued in the each unit period.

A9. The controller as A1, wherein the command issuing unit issues a second command, that causes the semiconductor device to output the storage data through a data terminal or to control an impedance of the data terminal, to the semiconductor device during the self refresh mode.

A10. The controller as A1, further comprising a clock signal issuing unit that issues a clock signal having a predetermined frequency to the semiconductor device, wherein the command issuing unit issues the second command to the semiconductor device with no relation to the clock signal.

A11. The controller as any one of A1 to A11, further comprising a clock signal issuing unit that issues a clock signal having a predetermined frequency to first and second semiconductor devices in common.

A12. The controller as A11, further comprising:

a clock terminal connected in common to clock terminals of the first and second semiconductor devices so that the clock signal issuing unit issues the clock signal to the first and second semiconductor devices in common;

a data terminal connected in common to data terminals of the first and second semiconductor devices so that the storage data in the first and second semiconductor devices are transferred through a common data line;

a first clock enable terminal issuing a first clock enable signal indicating whether the clock signal supplied to the first semiconductor device is valid;

a second clock enable terminal issuing a second clock enable signal indicating whether the clock signal supplied to the second semiconductor device is valid;

a first ODT terminal issuing a first impedance control signal that controls an impedance of the data terminal of the first semiconductor device; and a second ODT terminal issuing a second impedance control signal that controls an impedance of the data terminal of the second semiconductor device;

wherein the self-refresh exit commands for the first and second semiconductor devices are expressed by using the first and second clock enable signals, respectively.

A13. The controller as any one of A1 to A10, further comprising:

a first clock terminal issuing a first clock signal having a predetermined frequency to a first semiconductor device;

a second clock terminal issuing a second clock signal having the predetermined frequency to a second semiconductor device;

a data terminal connected in common to data terminals of the first and second semiconductor devices so that the storage data in the first and second semiconductor devices are transferred through a common data line;

a first clock enable terminal issuing a first clock enable signal indicating whether the clock signal supplied to the first semiconductor device is valid;

a second clock enable terminal issuing a second clock enable signal indicating whether the clock signal supplied to the second semiconductor device is valid;

a first ODT terminal issuing a first impedance control signal that controls an impedance of the data terminal of the first semiconductor device; and a second ODT terminal issuing a second impedance control signal that controls an impedance of the data terminal of the second semiconductor device.

A14. The controller as A13, wherein the first and second semiconductor devices are mounted on different module substrates.

A15. The controller as any one of A11 to A14, further comprising:

a first chip select terminal issuing a first chip select signal that selects the first semiconductor device; and a second chip select terminal issuing a second chip select signal that selects the second semiconductor device.

A16. The controller as A1, further comprising a refresh managing unit that controls an issuance timing of the self-refresh command and the self-refresh exit command, wherein the refresh managing unit causes the command issuing unit to alternately and periodically issue the self-refresh command and the self-refresh exit command in a pseudo self-refresh mode, the command issuing unit does not issue any command while a period after issuing the self-refresh exit command until issuing the self-refresh command in the pseudo self-refresh mode.

A17. The controller as A16, further comprising a clock signal issuing unit that issues a clock signal having a predetermined frequency to the semiconductor device, wherein the self-refresh command is expressed by a first logical combination of command signals and an enable signal having a first logic level, and the self-refresh exit command is expressed by a transition from the first logic level to a second logic level of the enable signal.

A18. The controller as A17, wherein the command issuing unit periodically issues the auto-refresh command that is expressed by the first logical combination of the command signals and the enable signal having the second logic level.

A19. The controller as A18, wherein the refresh managing unit substantially matches a number of the self-refresh commands issued in each unit period with a number of the auto-refresh commands issued in the each unit period.

A20. The controller as any one of A17 to A19, wherein the command issuing unit issues a second command, that causes the semiconductor device to output the storage data through a data terminal or to control an impedance of the data terminal, to the semiconductor device, the power-down command is expressed by a second logical combination of command signals and the enable signal having the first logic level, the power-down exit command is expressed by a transition from the first logic level to the second logic level of the enable signal, a minimum interval from issuing the self-refresh exit command to issuing the first command is substantially the same as a minimum interval from issuing the power-down exit command to issuing the first command, and a minimum interval from issuing the self-refresh exit command to issuing the second command is substantially the same as a minimum interval from issuing the power-down exit command to issuing the second command.

A21. The controller as any one of A16 to A20, further comprising a clock signal issuing unit that issues a clock signal having a predetermined frequency to the semiconductor device, wherein the clock signal issuing unit stops issuing the clock signal while the semiconductor device is in the self-refresh mode.

A22. The controller as A21, wherein the clock signal issuing unit reissues the clock signal to the semiconductor device even before the command issuing unit issues the self-refresh exit command.

A23. The controller as A21 or A22, wherein the clock signal issuing unit continuously issues the clock signal to the semiconductor device until elapse of the predetermined period from an issuance of the self-refresh exit command even if the command issuing unit reissues the self-refresh command.

A24. The controller as any one of A16 to A23, wherein the command issuing unit, in a first operation mode, issues the self-refresh exit command after elapse more than a first period from issuing the self-refresh command, and the command issuing unit, in a second operation mode, issues the self-refresh commands in a cycle of the first period during the pseudo self-refresh mode.

A25. The controller as A24, wherein the command issuing unit, in the first operation mode, a minimum interval from issuing the self-refresh exit command to issuing the first command is set to a first time length, and a minimum interval from issuing the self-refresh exit command to issuing a second command that controls a data terminal of the semiconductor device is set to a second time length, the command issuing unit, in the second operation mode, a minimum interval from issuing the self-refresh exit command to issuing the first command is set to a third time length that is shorter than the first time length, and a minimum interval from issuing the self-refresh exit command to issuing the is set to a fourth time length that is shorter than the second time length.

A26. The controller as A24 or A25, wherein the command issuing unit further issues a mode-register set command that brings the semiconductor device into the first or second operation mode, A27. The controller as A24 or A25, wherein the command further issues an additional signal that brings the semiconductor device into the first or second operation mode along with the self-refresh command.

A28. The controller as A27, further comprising:

a data processor that processes the storage data transmitted to or received from the semiconductor device through a data line; and an address processor that specifies an address of the storage data, wherein the data processor or the address processor issues the additional signal.

A29. A control method of a controller, the method comprising:

issuing a self-refresh command that causes a semiconductor device to enter a self-refresh mode in which a refresh operation on a predetermined number of memory cells included in memory cell array of the semiconductor device is performed;

issuing a self-refresh exit command that causes the semiconductor device to exit the self-refresh mode;

issuing an auto-refresh command that causes the semiconductor device to perform the refresh operation on the predetermined number of the memory cells;

issuing a power-down command that causes the semiconductor device to enter a power-down mode in which the semiconductor device reduces a power consumption thereof without performing the refresh operation;

issuing a power-down exit command that causes the semiconductor device to exit the power-down mode; and issuing a first command that causes the semiconductor device to perform an access operation to storage data in the memory cell array, wherein an interval of issuing the self-refresh commands is substantially the same as that of the auto-refresh commands, the controller issues the first command to the semiconductor device after elapse of a first period at earliest from issuing the power-down exit command, and the controller issues the first command to the semiconductor device after elapse of a second period that is substantially the same time length as the first period at earliest from issuing the self-refresh exit command.

A30. The control method of the controller as A29, the method further comprising:

issuing a second command, that causes the semiconductor device to output the storage data through a data terminal or to control an impedance of the data terminal, to the semiconductor device after elapse of a third period at earliest from issuing the power-down exit command; and issuing the second command to the semiconductor device after elapse of a fourth period that is substantially the same time length as the third period at earliest from issuing the self-refresh exit command.

A31. The control method of the controller as A29 or A30, wherein the controller issues the first command to the semiconductor device after elapse of a fifth period that is longer than the first and second periods at earliest from issuing the auto-refresh command.

A32. The control method of the controller as A30 or A31, wherein the controller issues the second command to the semiconductor device after elapse of a sixth period that is longer than the third and fourth periods at earliest from issuing the auto-refresh command.

A33. The control method of the controller as any one of A29 to A32, the method further comprising issuing a clock signal having a predetermined frequency to the semiconductor device, wherein the controller continuously issues the clock signal to the semiconductor device even if the semiconductor device is in the power-down mode, and the controller stops issuing the clock signal while the semiconductor device is in the self-refresh mode, and reissuing the clock signal to the semiconductor device for a predetermined period in conjunction with the self-refresh exit command.

A34. The control method of the controller as A33, wherein the controller reissues the clock signal to the semiconductor device even before the controller issues the self-refresh exit command.

A35. The control method of the controller as A33 or A34, wherein the controller continuously issues the clock signal to the semiconductor device until elapse of the predetermined period from an issuance of the self-refresh exit command even if the controller reissues the self-refresh command.

A36. The control method of the controller as any one of A29 to A35, wherein a number of the self refresh commands issued in each unit period is substantially the same as a number of the auto-refresh commands issued in the each unit period.

A37. The control method of the controller as A29, wherein the controller issues a second command, which causes the semiconductor device to control an impedance of a data terminal thereof, to the semiconductor device during the self-refresh mode.

A38. The control method of the controller as A37, the method further comprising issuing a clock signal having a predetermined frequency to the semiconductor device, wherein the controller issues the second command to the semiconductor device with no relation to the clock signal.

A39. The control method of the controller as any one of A29 to A38, the method further comprising issuing a clock signal having a predetermined frequency to first and second semiconductor devices in common.

A40. The control method of the controller as A39, the method further comprising:

supplying the storage data to a common data line connected in common to the first and second semiconductor devices;

supplying a first clock enable signal indicating whether the clock signal supplied to the first semiconductor device is valid;

supplying a second clock enable signal indicating whether the clock signal supplied to the second semiconductor device is valid;

supplying a first impedance control signal that controls an impedance of a data terminal of the first semiconductor device; and supplying a second impedance control signal that controls an impedance of a data terminal of the second semiconductor device, wherein the self-refresh exit commands for the first and second semiconductor devices are expressed by using the first and second clock enable signals, respectively.

A41. The control method of the controller as any one of A29 to A38, the method further comprising:

supplying a first clock signal having a predetermined frequency to a first semiconductor device;

supplying a second clock signal having the predetermined frequency to a second semiconductor device;

supplying the storage data to a common data line connected in common to the first and second semiconductor devices;

supplying a first clock enable signal indicating whether the clock signal supplied to the first semiconductor device is valid;

supplying a second clock enable signal indicating whether the clock signal supplied to the second semiconductor device is valid;

supplying a first impedance control signal that controls an impedance of a data terminal of the first semiconductor device; and supplying a second impedance control signal that controls an impedance of a data terminal of the second semiconductor device.

A42. The control method of the controller as A41, wherein the first and second semiconductor devices are mounted on different module substrates.

A43. The control method of the controller as any one of A39 to A42, the method further comprising:

supplying a first chip select signal that selects the first semiconductor device; and supplying a second chip select signal that selects the second semiconductor device.

A44. A control method of an information processing system having a controller and a semiconductor device, the method comprising:

issuing, from the controller to the semiconductor device, a self-refresh command, a self-refresh exit command, an auto-refresh command, a power-down command, a power-down exit command, and a first command, wherein the controller issues the first command to the semiconductor device after elapse of a first period at earliest from issuing the power-down exit command, and wherein the controller issues the first command to the semiconductor device after elapse of a second period that is substantially the same time length as the first period at earliest from issuing the self-refresh exit command;

entering a self-refresh mode in which a refresh operation on a predetermined number of memory cells included in memory cell array of the semiconductor device is performed in response to the self-refresh command;

exiting the self-refresh mode in response to the self-refresh exit command;

performing a refresh operation on the predetermined number of the memory cells in response to the auto-refresh command;

entering a power-down mode in which the semiconductor device reduces a power consumption thereof without performing the refresh operation;

exiting the power-down mode in response to the power-down exit command; and performing an access operation to storage data in the memory cell array in response to the first command.

A45. The control method of the information processing system as A44, the method further comprising:

issuing, from the controller to the semiconductor device, a second command after elapse of a third period at earliest from issuing the power-down exit command; and issuing, from the controller to the semiconductor device, the second command after elapse of a fourth period that is substantially the same time length as the third period at earliest from issuing the self-refresh exit command, wherein the semiconductor device outputs the storage data through a data terminal or controls an impedance of the data terminal in response to the second command.

A46. The control method of the information processing system as A44 or A45, wherein the controller issues the first command to the semiconductor device after elapse of a fifth period that is longer than the first and second periods at earliest from issuing the auto-refresh command.

A47. The control method of the information processing system as A45 or A46, wherein the controller issues the second command to the semiconductor device after elapse of a sixth period that is longer than the third and fourth periods at earliest from issuing the auto-refresh command.

A48. The control method of the information processing system as any one of A44 to A47, the method further comprising issuing a clock signal having a predetermined frequency from the controller to the semiconductor device, wherein the controller continuously issues the clock signal to the semiconductor device even if the semiconductor device is in the power-down mode, and the controller stops issuing the clock signal while the semiconductor device is in the self-refresh mode, and reissuing the clock signal to the semiconductor device for a predetermined period in conjunction with the self-refresh exit command.

A49. The control method of the information processing system as A48, wherein the controller reissues the clock signal to the semiconductor device even before the controller issues the self-refresh exit command.

A50. The control method of the information processing system as A48 or A49, wherein the controller continuously issues the clock signal to the semiconductor device until elapse of the predetermined period from an issuance of the self-refresh exit command even if the controller reissues the self-refresh command.

A51. The control method of the information processing system as any one of A44 to A50, wherein a number of the self-refresh commands issued in each unit period is substantially the same as a number of the auto-refresh commands issued in the each unit period.

A52. The control method of the information processing system as A44, wherein the controller issues a second command, which causes the semiconductor device to control an impedance of a data terminal thereof, to the semiconductor device during the self-refresh mode.

A53. The control method of the information processing system as A52, the method further comprising issuing a clock signal having a predetermined frequency from the controller to the semiconductor device, wherein the controller issues the second command to the semiconductor device with no relation to the clock signal, and the semiconductor device controls the impedance of the data terminal asynchronously with the clock signal.

A54. The control method of the information processing system as any one of A44 to A53, the method further comprising issuing a clock signal having a predetermined frequency from the controller to first and second semiconductor devices in common.

A55. The control method of the information processing system as A54, the method further comprising:

supplying the storage data from the controller to a common data line connected in common to the first and second semiconductor devices;

supplying, from the controller to the first semiconductor device, a first clock enable signal indicating whether the clock signal supplied to the first semiconductor device is valid;

supplying, from the controller to the second semiconductor device, a second clock enable signal indicating whether the clock signal supplied to the second semiconductor device is valid;

supplying, from the controller to the first semiconductor device, a first impedance control signal that controls an impedance of a data terminal of the first semiconductor device; and supplying, from the controller to the second semiconductor device, a second impedance control signal that controls an impedance of a data terminal of the second semiconductor device, wherein the self-refresh exit commands for the first and second semiconductor devices are expressed by using the first and second clock enable signals, respectively.

A56. The control method of the information processing system as any one of A44 to A53, the method further comprising:

supplying a first clock signal having a predetermined frequency from the controller to a first semiconductor device;

supplying a second clock signal having the predetermined frequency from the controller to a second semiconductor device;

supplying the storage data from the controller to a common data line connected in common to the first and second semiconductor devices;

supplying, from the controller to the first semiconductor device, a first clock enable signal indicating whether the clock signal supplied to the first semiconductor device is valid;

supplying, from the controller to the second semiconductor device, a second clock enable signal indicating whether the clock signal supplied to the second semiconductor device is valid;

supplying, from the controller to the first semiconductor device, a first impedance control signal that controls an impedance of a data terminal of the first semiconductor device; and supplying, from the controller to the second semiconductor device, a second impedance control signal that controls an impedance of a data terminal of the second semiconductor device.

A57. The control method of the information processing system as A56, wherein the first and second semiconductor devices are mounted on different module substrates.

A58. The control method of the information processing system as any one of A54 to A57, the method further comprising:

supplying, from the controller to the first semiconductor device, a first chip select signal that selects the first semiconductor device; and supplying, from the controller to the second semiconductor device, a second chip select signal that selects the second semiconductor device.

A59. A semiconductor device comprising:

a first input buffer circuit to which an external clock signal having a predetermined frequency is supplied from outside;

a DLL circuit that generates an internal clock signal that is phase-controlled based on an output signal from the first input buffer circuit;

a memory cell array that has a plurality of memory cells requiring an refresh operation in order to retain of storage data therein;

an output buffer circuit that outputs the storage data read from the memory cell array to outside through a data terminal synchronously with the internal clock signal; and an access control circuit, wherein the access control circuit performs an access operation to the memory cell array in response to the first command, the access control circuit outputs the storage data through the data terminal or controls an impedance of the data terminal in response to the second command, the access control circuit performs the refresh operation on a predetermined number of the memory cells in a first period in response to an auto-refresh command, the access control circuit performs the refresh operation on the predetermined number of the memory cells in the first period and enters a self-refresh mode in response to a self-refresh command, and the access control circuit temporarily activates the DLL circuit to update a state thereof in connection with the self-refresh mode.

A60. The semiconductor device as A59, wherein the access control circuit exits the self-refresh mode in response to a self-refresh exit command, and the access control circuit temporarily activates the DLL circuit in response to the self-refresh command or the self-refresh exit command.

A61. The semiconductor device as A60, wherein the access control circuit, in response to the second command after an issuance of the self-refresh exit command, controls the impedance of the data terminal synchronously with the internal clock signal generated by the DLL circuit in which the state thereof is updated in response to the self-refresh command or the self-refresh exit command.

A62. The semiconductor device as A60 or A61, wherein the access control circuit temporarily activates the DLL circuit in response to the self-refresh exit command, and the access control circuit inactivates the first input buffer circuit in response to the self-refresh command.

A63. The semiconductor device as A62, wherein the access control circuit keeps the first input buffer circuit in an active state until elapse of a second period from an issuance of the self-refresh exit command even if the self-refresh command is reissued.

A64. The semiconductor device as A62 or A63, further comprising a second input buffer circuit to which an impedance control signal that controls an impedance of the data terminal is supplied from outside, wherein the access control circuit further inactivates the second input buffer circuit during the self-refresh mode.

A65. The semiconductor device as any one of A62 to A64, wherein the access control circuit outputs an update start signal that activates the DLL circuit in response to the self-refresh exit command, the DLL circuit outputs an update end signal to the access control circuit in response to acquisition of a desired phase of the internal clock signal, and the access control circuit activates the first input buffer circuit synchronously with the update start signal and inactivates the first input buffer circuit synchronously with the update end signal.

A66. The semiconductor device as any one of A59 to A65, further comprising a third input buffer circuit to which a clock enable signal indicating whether the external clock signal is valid is supplied from outside, wherein the self-refresh exit command is indicated by the clock enable signal.

A67. The semiconductor device as A66, wherein the self-refresh command is indicated by a signal from a command terminal through which the first and second commands are supplied, and the clock enable signal.

A68. The semiconductor device as any one of A59 to A67, wherein the access control circuit, in a first operation mode, repeatedly performs the refresh operation on the predetermined number of memory cells in the first period during the self-refresh mode, and the access control circuit, in a second operation mode, performs the refresh operation once in response to the self-refresh command.

A69. The semiconductor device as A68, wherein the access control circuit, in the first operation mode, activates the DLL circuit in response to the self-refresh exit command with resetting information related to a delay amount of the DLL circuit, and the access control circuit, in the second operation mode, activates the DLL circuit in response to the self-refresh exit command without resetting the information.

A70. The semiconductor device as A68 or A69, wherein the semiconductor device is set to the first or second operation mode according to a mode-register set command supplied from outside.

A71. The semiconductor device as A68 or A69, wherein the semiconductor device is set in the first or second operation mode according to an additional signal supplied from outside along with the self-refresh command.

A72. The semiconductor device as any one of A59 or A63, further comprising a second input buffer circuit to which an impedance control signal that controls an impedance of the data terminal is supplied from outside, wherein the access control circuit, in a first operation mode, inactivates the second input buffer circuit during the self-refresh mode, and the access control circuit, in a second operation mode, activates the second input buffer circuit during the self-refresh mode.

A73. The semiconductor device as A72, wherein the access control circuit, in the second operation mode, controls the impedance of the data terminal asynchronously with the external clock signal or the internal clock signal when the impedance control signal is issued during the self-refresh mode.

A74. The semiconductor device as A72 or A73, wherein the access control circuit controls the impedance of the data terminal synchronously with the external clock signal or the internal clock signal in response to issuance of the impedance control signal during a period while the semiconductor device in not in the self-refresh mode, in both of the first and second operation modes.

What is claimed is:

1. An information processing system comprising:
   a first device including a memory cell array that holds storage data, an access control circuit that performs an access operation to the memory cell array and controls a power consumption of the first device; and
   a second device including a command issuing unit that issues a self-refresh command, a self-refresh exit command, an auto-refresh command, a power-down command, a power-down exit command, and a first command to the first device, wherein
   the command issuing unit issues the first command to the first device after elapse of a first period at earliest from issuing the power-down exit command,
   the command issuing unit issues the first command to the first device after elapse of a second period that is substantially the same time length as the first period at earliest from issuing the self-refresh exit command,
   the first device enters a self-refresh mode in response to the self-refresh command and exits the self-refresh mode in response to the self-refresh exit command,
   the access control circuit performs a refresh operation of the storage data on a first number of memory cells included in the memory cell array during the self-refresh mode,
   the access control circuit performs the refresh operation of the storage data on the first number of memory cells in response to the auto-refresh command,
   the first device enters a power-down mode in response to the power-down command and exits the power-down mode in response to the power-down exit command,
   the access control circuit reduces the power consumption without performing the refresh operation during the power-down mode, and
   the access control circuit performs the access operation to the memory cell array in response to the first command.

2. The information processing system as claimed in claim 1, wherein
   the first device further includes a first data terminal,
   the second device further includes a second data terminal connected to the first data terminal,
   the command issuing unit issues a second command to the first device after elapse of a third period at earliest from issuing the power-down exit command,
   the command issuing unit issues the second command to the first device after elapse of a fourth period that is substantially the same time length as the third period at earliest from issuing the self-refresh exit command, and
   the access control circuit outputs the storage data through the first data terminal after controls a impedance of the first data terminal in response to the second command.

3. The information processing system as claimed in claim 1, wherein the command issuing unit issues the first command to the first device after elapse of a fifth period that is longer than the thirst and second periods at earliest from issuing the auto-refresh command.

4. The information processing system as claimed in claim 2, wherein the command issuing unit issues the second command to the first device after elapse of a sixth period that is longer than the third and fourth periods at earliest from issuing the auto-refresh command.

5. The information processing system as claimed in claim 1, wherein
   the second device further includes a clock signal issuing unit that issues a clock signal having a predetermined frequency to the first device,
   the clock signal issuing unit continuously issues the clock signal to the first device even if the first device is in the power-down mode, and
   the clock signal issuing unit stops issuing the clock signal while the first device is in the self-refresh mode, and reissuing the clock signal to the first device for a predetermined period in conjunction with the self-refresh exit command.

6. The information processing system as claimed in claim 5, wherein the clock signal issuing unit reissues the clock signal to the first device even before the command issuing unit issues the self-refresh exit command.

7. The information processing system as claimed in claim 5, wherein the clock signal issuing unit continuously issues the clock signal to the first device until elapse of the predetermined period from an issuance of the self-refresh exit command even if the command issuing unit reissues the self-refresh command.

8. The information processing system as claimed in claim 1, wherein a number of the self-refresh commands issued in each unit period is substantially the same as a number of the auto-refresh commands issued in the each unit period.

9. The information processing system as claimed in claim 1, wherein
   the first device further includes a first data terminal,
   the second device further includes a second data terminal connected to the first data terminal,
   the command issuing unit issues a second command to the first device during the self-refresh mode, and
   the access control circuit controls an impedance of the first data terminal in response to the second command.

10. The information processing system as claimed in claim 9, wherein
    the second device further includes a clock signal issuing unit that issues a clock signal having a predetermined frequency to the first device, and
    the command issuing unit issues the second command to the first device with no relation to the clock signal.

11. The information processing system as claimed in claim 1, further comprising a third device having substantially the same configuration as the first device,
    wherein the second device further includes a clock signal issuing unit that issues a clock signal having a predetermined frequency to the first and third devices in common.

12. The information processing system as claimed in claim 11, wherein
    the first, second and third devices includes clock terminals, data terminals, clock enable terminals, and ODT terminals,
    the clock terminals of the first and third devices are connected in common to the clock terminal of the second device so that the clock signal issuing unit issues the clock signal to the first and third devices in common, the data terminals of the first and third devices are connected in common to the data terminal of the second device so that the storage data in the first and third devices are transferred through a common data line, the clock enable terminal of the first device is connected to one of the clock enable terminals of the second device without connected to other of the clock enable terminals of the second device so that the command issuing unit selectively issues a first clock enable signal indicating whether the clock signal supplied to the first device is valid, the clock enable terminal of the third device is connected to the other of the clock enable terminals of the second device without connected to the one of the clock enable terminals of the second device so that the command issuing unit selectively issues a second clock enable signal indicating whether the clock signal supplied to the third device is valid, the ODT terminal of the first device is connected to one of the ODT terminals of the second device without connected to other of the ODT terminals of the second device so that the command issuing unit selectively issues a first impedance control signal that controls an impedance of the data terminal of the first device, the ODT terminal of the third device is connected to the other of the ODT terminals of the second device without connected to the one of the ODT terminals of the second device so that the command issuing unit selectively issues a second impedance control signal that controls an impedance of the data terminal of the third device, and the self-refresh exit commands for the first and third devices are expressed by using the first and second clock enable signals, respectively.

13. The information processing system as claimed in claim 1, further comprising a third device having substantially the same configuration as the first device, wherein the first, second and third devices includes clock terminals, data terminals, clock enable terminals, and ODT terminals, the data terminals of the first and third devices are connected in common to the data terminal of the second device so that the storage data in the first and third devices are transferred through a common data line, the clock terminal of the first device is connected to one of the clock terminals of the second device without connected to other of the clock terminals of the second device so that a clock issuing unit included in the second device selectively issues a first clock signal to the first device, the clock terminal of the third device is connected to the other of the clock terminals of the second device without connected to the one of the clock terminals of the second device so that the clock issuing unit selectively issues a second clock signal to the third device, the clock enable terminal of the first device is connected to one of the clock enable terminals of the second device without connected to other of the clock enable terminals of the second device so that the command issuing unit selectively issues a first clock enable signal indicating whether the first clock signal is valid, the clock enable terminal of the third device is connected to the other of the clock enable terminals of the second device without connected to the one of the clock enable terminals of the second device so that the command issuing unit selectively issues a second clock enable signal indicating whether the second clock signal is valid, the ODT terminal of the first device is connected to one of the ODT terminals of the second device without connected to other of the ODT terminals of the second device so that the command issuing unit selectively issues a first impedance control signal that controls an impedance of the data terminal of the first device, and the ODT terminal of the third device is connected to the other of the ODT terminals of the second device without connected to the one of the ODT terminals of the second device so that the command issuing unit selectively issues a second impedance control signal that controls an impedance of the data terminal of the third device.

14. The information processing system as claimed in claim 13, wherein the first and third devices are mounted on different module substrates.

15. The information processing system as claimed in claim 1, further comprising a third device having substantially the same configuration as the first device, wherein the first, second and third devices includes chip select terminals, the chip select terminal of the first device is connected to one of the chip select terminals of the second device without connected to other of the chip select terminals of the second device so that the command issuing unit selectively issues a first chip select signal that selects the first device, and the chip select terminal of the third device is connected to the other of the chip select terminals of the second device without connected to the one of the chip select terminals of the second device so that the command issuing unit selectively issues a second chip select signal that selects the third device.

* * * * *